United States Patent
Moslehi et al.

(10) Patent No.: US 9,196,759 B2
(45) Date of Patent: Nov. 24, 2015

(54) HIGH-EFFICIENCY PHOTOVOLTAIC BACK-CONTACT SOLAR CELL STRUCTURES AND MANUFACTURING METHODS

(71) Applicant: SOLEXEL, INC., Milpitas, CA (US)

(72) Inventors: Mehrdad M. Moslehi, Los Altos, CA (US); Pawan Kapur, Palo Alto, CA (US); Karl-Josef Kramer, San Jose, CA (US); David Xuan-Qi Wang, Fremont, CA (US); Sean M. Seutter, San Jose, CA (US); Virendra V. Rana, Los Gatos, CA (US); Anthony Calcaterra, Milpitas, CA (US); Emmanuel Van Kerschaver, Los Altos, CA (US)

(73) Assignee: Solexel, Inc., Milpitas, CA (US)

( * ) Notice: Subject to any disclaimer, the term of this patent is extended or adjusted under 35 U.S.C. 154(b) by 0 days.

(21) Appl. No.: 14/629,273

(22) Filed: Feb. 23, 2015

(65) Prior Publication Data
US 2015/0243814 A1 Aug. 27, 2015

Related U.S. Application Data

(63) Continuation of application No. 13/057,104, filed as application No. PCT/US2010/059759 on Dec. 9, 2010, now Pat. No. 8,962,380.

(60) Provisional application No. 61/285,140, filed on Dec. 9, 2009.

(51) Int. Cl.
| | |
|---|---|
| H01L 31/0224 | (2006.01) |
| H01L 31/18 | (2006.01) |
| H01L 31/0216 | (2014.01) |
| H01L 31/056 | (2014.01) |

(52) U.S. Cl.
CPC .. *H01L 31/022458* (2013.01); *H01L 31/02167* (2013.01); *H01L 31/056* (2014.12)

(58) Field of Classification Search
None
See application file for complete search history.

(56) References Cited

U.S. PATENT DOCUMENTS 8,962,380 B2 * 2/2015 Moslehi et al. ............. 438/98

* cited by examiner

*Primary Examiner* — Seahvosh Nikmanesh
(74) *Attorney, Agent, or Firm* — John Wood

(57) ABSTRACT

Back contact back junction solar cell and methods for manufacturing are provided. The back contact back junction solar cell comprises a substrate having a light capturing frontside surface with a passivation layer, a doped base region, and a doped backside emitter region with a polarity opposite the doped base region. A backside passivation layer and patterned reflective layer on the emitter form a light trapping backside mirror. An interdigitated metallization pattern is positioned on the backside of the solar cell and a permanent reinforcement provides support to the cell.

16 Claims, 33 Drawing Sheets

Solar Cell Frontside (Sunny Side)

Solar Cell Backside (Contact Side)

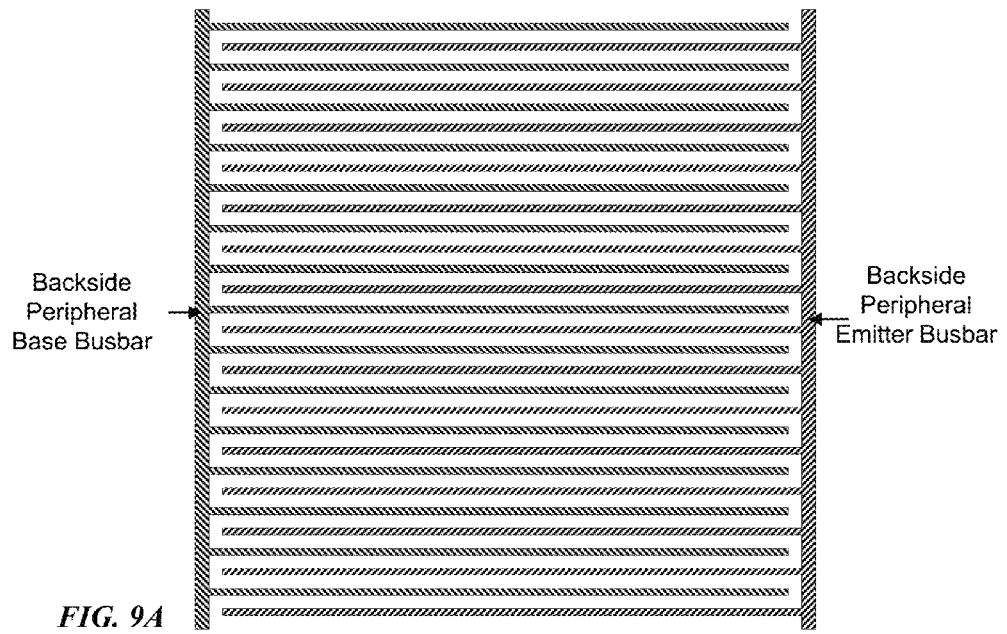
FIG. 9A — Backside Peripheral Base Busbar, Backside Peripheral Emitter Busbar
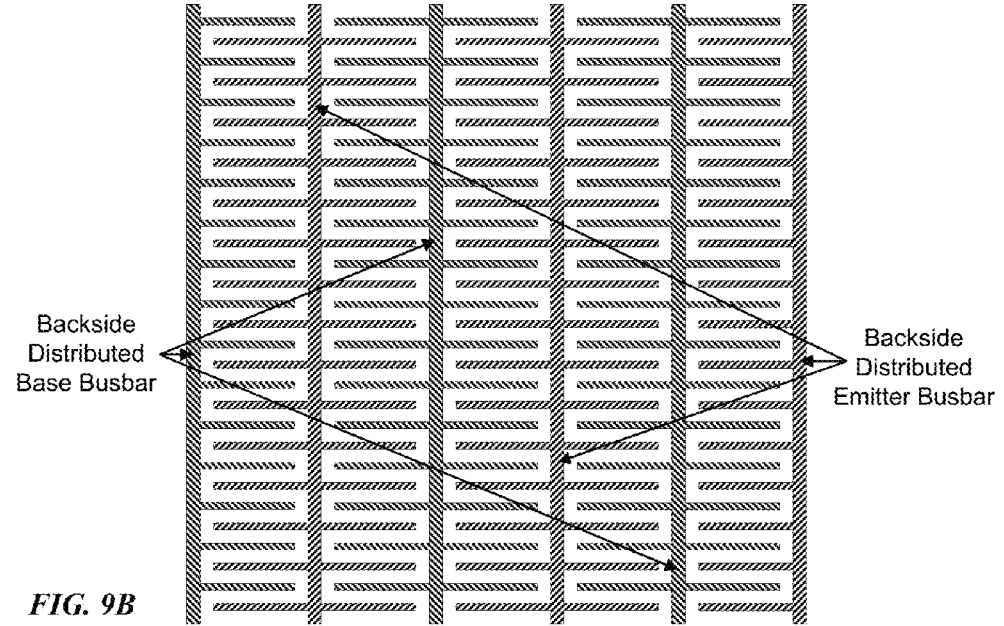
FIG. 9B — Backside Distributed Base Busbar, Backside Distributed Emitter Busbar

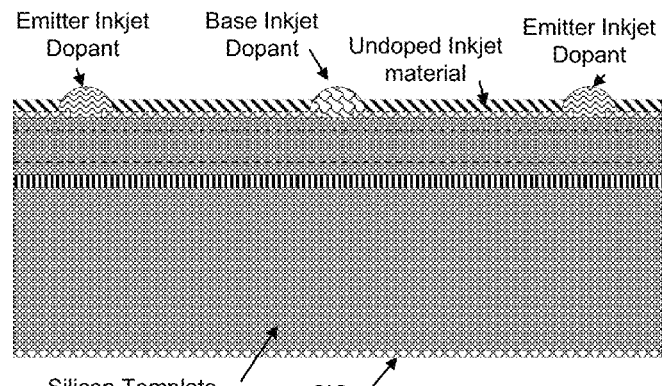
FIG. 12D
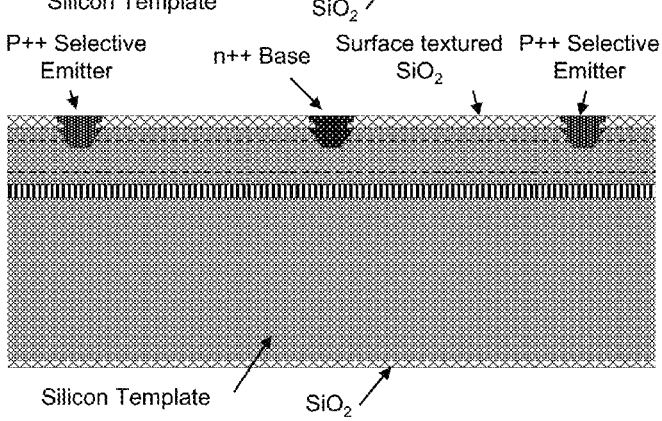
FIG. 12E
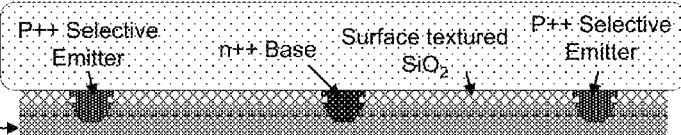
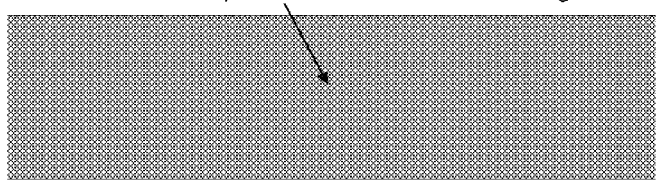
FIG. 12F

*FIG. 19D*
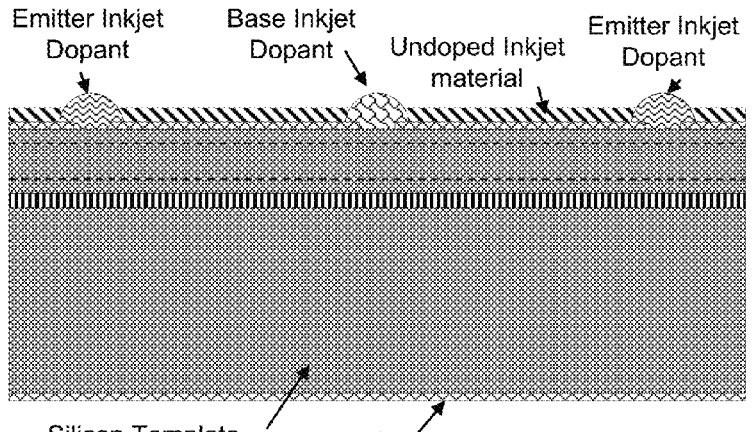
*FIG. 19E*
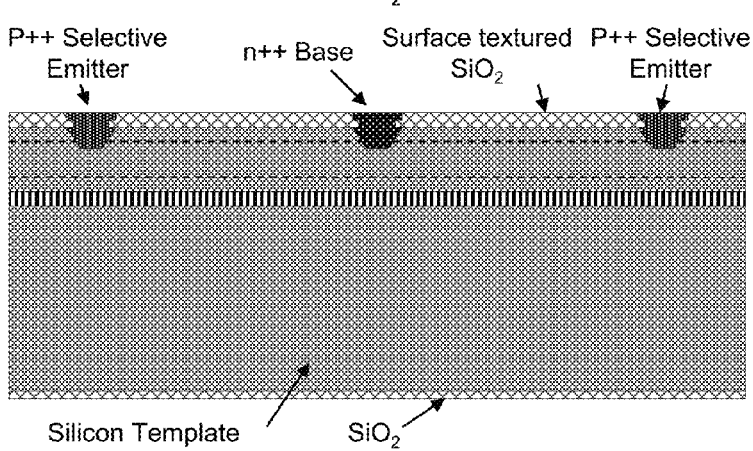
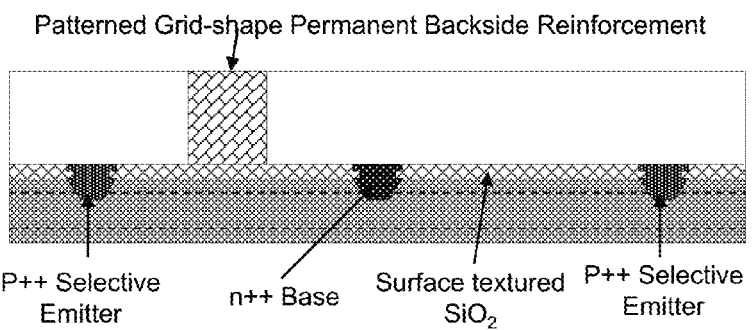
*FIG. 19F*

Figure 21. Cross-sectional schematic view of the substantially planar epitaxial substrate non-selective emitter solar cell with front side reinforcement and back side contact that has abutted junctions and integrated Lambertian mirror (FSR-AJ-NS).

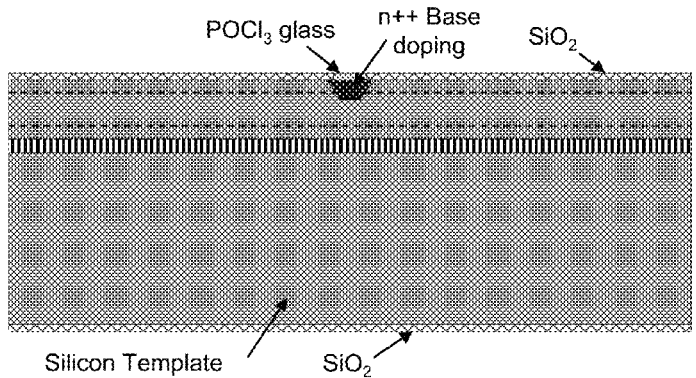
*FIG. 22D*
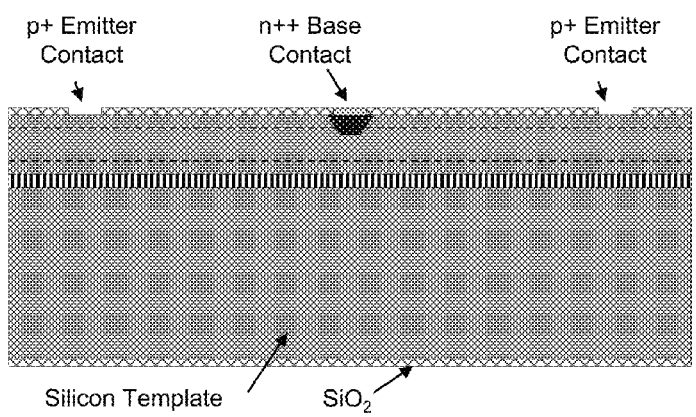
*FIG. 22E*
*FIG. 22F*

HIGH-EFFICIENCY PHOTOVOLTAIC BACK-CONTACT SOLAR CELL STRUCTURES AND MANUFACTURING METHODS

RELATED APPLICATIONS

This application is a continuation of U.S. application Ser. No. 13/057,104 filed Aug. 13, 2012 which is a National Stage of International Application No. PCT/US2010/059759 filed Dec. 9, 2010 which claims the benefit of U.S. Provisional Application No. 61/285,140 filed on Dec. 9, 2009, all of which are hereby incorporated by reference in their entirety for all purposes.

FIELD

This disclosure relates in general to the field of photovoltaics and solar cells, and more particularly to back contact back junction thin solar cells and methods for manufacturing.

BACKGROUND

Currently, crystalline silicon has the largest market share in the photovoltaics (PV) industry, accounting for over 80% of the overall PV market share. And although moving to thinner crystalline silicon solar cells is long understood to be one of the most potent and effective strategy for PV cost reduction (because of the relatively high material cost of crystalline silicon wafers used in solar cells as a fraction of the total PV module cost), utilizing thinner crystalline is fraught with the problem of mechanical breakage caused by thin and often large substrate sizes. Other problems include inadequate light trapping in the thin structure because silicon is an indirect bandgap semiconductor material. Further, it is difficult balance the requirement of high mechanical yield and reduced wafer breakage rate with high manufacturing yields in PV factories in a cost effective manner.

On a standalone crystalline silicon solar cell without support, moving even slightly thinner than the current thickness range of 140 μm-250 μm starts to severely compromise mechanical yield during manufacturing. Thin film silicon is particularly mechanically fragile causing manufacturing and processing difficulties. Thus, solutions directed to process very thin solar cell structures may utilize a cell process during which the cell is fully supported by a host carrier throughout, or a cell process which utilizes a novel self-supporting, standalone, substrate with an accompanying structural innovation.

Although, in the past, there have been attempts in solar industry to use carriers such as glass for thin substrates, these carriers have suffered from serious limitations including low maximum processing temperatures (in the case of glass) which potentially compromises the solar cell efficiency. There have also been attempts to make small area thin cells which do not have serious breakage concerns; however, large cell areas are required for commercial viability.

Achieving high cell and module efficiency with a low fabrication cost is critical in solar cell development and manufacturing. Back junction/back contacted cell architecture is capable of very high efficiency—primarily because there is no metal shading on the front side and no emitter on the front which helps result in a high blue response, and also because of the potentially low metal resistance on the backside. It is known to those versed in the field that back contacted cell demands a very high minority carrier diffusion length to substrate thickness ratio (while a good criteria to have for any solar cell architecture including front contact cells, this is especially important for back contact cells). The ratio should typically be greater than five.

Because cell thickness cannot be reduced easily without compromising mechanical yield, for current back contact back junction solar cells the emphasis is to use a very high lifetime material. And while this may result in a larger diffusion length, using a high lifetime material also increases the substrate cost. However, by using thin cells, the diffusion length does not have to be as high, resulting in an ease in the material quality requirements and thus the cost of the cell. This cost reduction is in addition to the obvious cost reduction of using less silicon. Thus, a back contact/back junction cell on a very thin crystalline silicon substrate has both a large cost and performance advantage.

SUMMARY

In accordance with the disclosed subject matter, innovative structures and methods for manufacturing very thin crystalline silicon, large area (suitable for commercial application), back contact/back junction solar cells are provided.

In one embodiment, the back contact back junction solar cell comprises a substrate having a light capturing frontside surface with a passivation layer, a doped base region, and a doped backside emitter region with a polarity opposite the doped base region. A backside passivation layer and patterned reflective layer on the emitter form a light trapping backside mirror. An interdigitated metallization pattern is positioned on the backside of the solar cell and a permanent reinforcement provides support to the cell.

The disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages included within this description, be within the scope of the accompanying claims.

BRIEF DESCRIPTIONS OF THE DRAWINGS

For a more complete understanding of the disclosed subject matter and advantages thereof, reference is now made to the following description taken in conjunction with the accompanying drawings in which like reference numbers indicate like features and wherein:

FIGS. 9A and 9B are diagrams illustrating two busbar designs in accordance with the disclosed subject matter;

FIGS. 12A through 12J are cross sectional diagrams of the solar cell after key fabrication process steps of FIG. 11;

FIGS. 19A through 19I are cross sectional diagrams of the solar cell after key fabrication process steps of FIG. 18;

FIGS. 22A through 22J are cross sectional diagrams of the solar cell after key fabrication process steps of FIG. 21.

DETAILED DESCRIPTION OF THE SPECIFIC EMBODIMENTS

Figure 1:
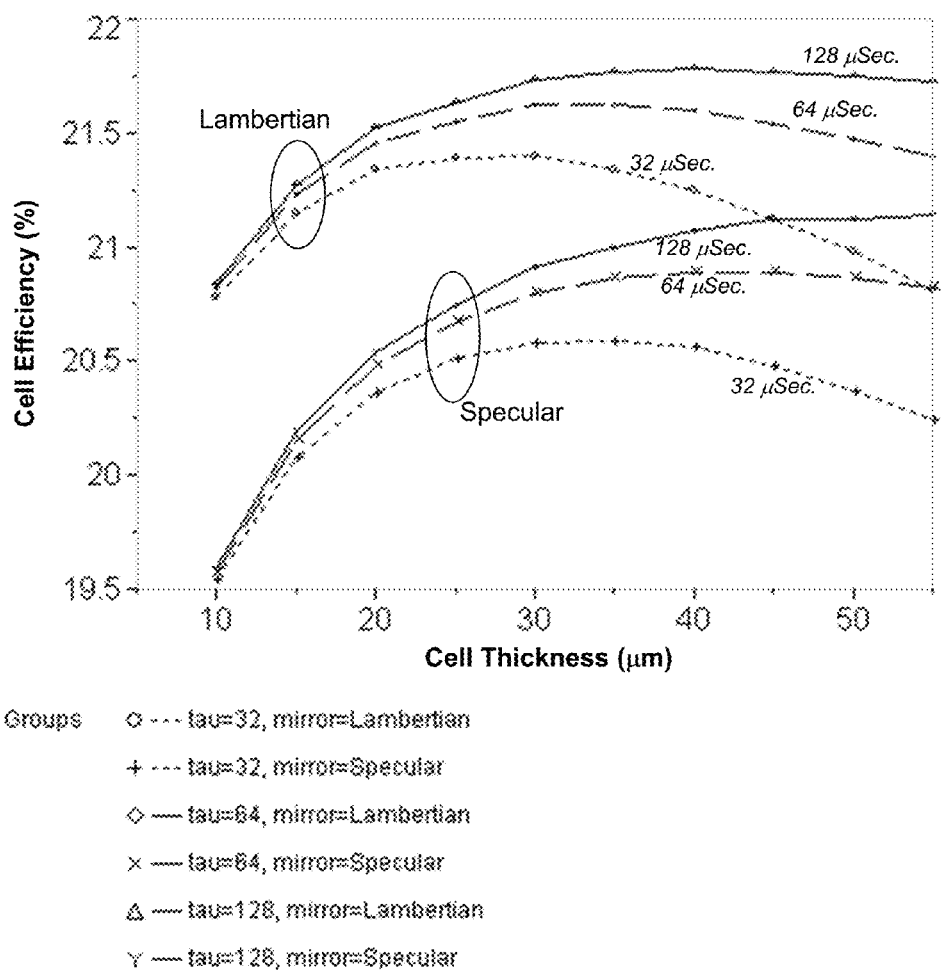
FIG. 1 is a graph illustrating a simulation result for determining the optimum thin film silicon substrate (TFSS) thickness for maximizing solar cell efficiency.

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

FIG. 1 is a graph illustrating a simulation result for determining the optimum thin film silicon substrate (TFSS) thickness for maximizing solar cell efficiency by taking the minority carrier bulk silicon lifetime and back mirror reflector quality (lambertian and specular) into account. A key parameter in designing a back contact back junction solar cell is to determine the TFSS thickness. Typically, there exists an optimum thickness of the silicon layer which maximizes cell efficiency. Optimum thickness depends on several parameters including the bulk lifetime of the silicon material and the degree of light trapping enabled by the back surface diffuse mirror properties. The optimum thickness is due to the following tradeoff The necessity toward minimizing minority carrier recombination drives substrate thickness lower while requirement of more efficiency light trapping drives the thickness higher. FIG. 1 shows a simulation of cell efficiency as a function of TFSS thickness, minority carrier bulk lifetime, and specular and lambertian mirrors. It is evident that thinner film thicknesses and improved light trapping allows one to use lower lifetime material. Based on economic and other advantages of using thinner films, a TFSS thickness optimum in the range of between 15 um to 30 um may be found. However, this simulation only represents a specific example and in general substrate thickness may be dictated by several considerations.

The present disclosure provides structural solutions and fabrication process solutions for back contact back junction thin semiconductor solar cells. And although described with reference to silicon, other semiconductor materials such as germanium or gallium arsenide may also be used without departing from the scope of the disclosed structures and methods. Heterojunctions and multijunction solar cells using silicon or other semiconductor materials are also within the scope of the disclosed subject matter.

In operation, large area (in the range of 156 mm×156 mm), thin solar cell substrates with a general thickness of less than 100 um (more specifically in 15 um to 50 um range) are first manufactured using epitaxial growth on top of a reusable template, and are subsequently dislodged. The reusable template may be substantially planar, or in another embodiment be have three-dimensional features. It is reused several times for epi growth, which amortizes template cost. The TFSS is released from the template using a sacrificial layer which not only is able to transfer the crystallinity from template to the TFSS, but is also easily removed selectively compared to the TFSS and the reusable template. One example of the sacrificial layer is porous silicon, whose porosity can be modulated or graded to achieve both the aforementioned critical functions. After the thin solar cell substrates are manufactured using above means, a key challenge is to handle these TFSS during fabrication of the solar cell without breakage and cracking. The following structures and methods address TFSS handling problems as well as provide increased overall efficiency.

Further, the disclosed subject matter provides solutions of the thin planar/substantially planar/or three dimensional TFSS handling by using temporary and/or permanent carriers for the TFSS during solar cell manufacturing process. Carrier is a loose term used to describe a robust material which is able to support the thin film solar substrate (TFSS). A key requirement for the successful fabrication of the cells described is that the TFSS should be supported during all process steps.

Because both sides of the solar cell need to be processed (a frontside and a backside) two carriers are usually required: one for support during the processing of each face of the solar cell. The carriers should satisfy several criteria: First, they should be cost-effective. The carrier cost should be less than the thickness of the silicon that they save. Second, at least one of the carriers must be able to withstand high temperature processing required in manufacturing of typical solar cells. In addition, if only one of the carriers is able to support high temperature cell processing, the process flow needs to be tailored to ensure that all high temperature processing steps are on this carrier. Third, at least one of the carriers must be able to withstand wet processing conditions required in manufacturing of the solar cell. An example of the wet processing steps includes silicon front surface texturing in diluted and heated KOH solutions. Fourth, once one side is partially or fully processed, the TFSS should be easily detached from the preferably reusable carrier (for high volume manufacturing) and transferred to the permanently attached end carrier (usually attached to the side which was processed first), in preparation for processing of the other side. Subsequently, in a case where the first side was only partially processed, the remaining steps should be able to be completed.

In the disclosed processes, the first carrier is a thick semiconductor (e.g., preferably crystalline silicon for crystalline silicon solar cells) wafer, such as a reusable template. The second carrier is a low cost material that may be capable of supporting TFSS permanently. The reusable template carrier, because it is standard thick silicon wafer, is capable of withstanding high temperature. The template can be in various sizes such as 200 mm or 300 mm, shapes, such as round or square, and thicknesses capable of going through full solar cell process without breaking (with thicknesses of 200 μm upwards). The cost of this carrier is brought down significantly by reusing and amortizing it over a plurality of TFSS fabrication cycles. Finally, this carrier also satisfies the aforementioned carrier criteria of being conducive to the detachment of the TFSS with high yield which is accomplished using a porous silicon layer between the template and the TFSS. Release processes include mechanical release (MR) or sonicated mechanical release in a liquid (SMR).

Several choices of second carriers are possible, forming different classes of manufacturing methods. All disclosed processes herein are characterized by the criteria that at least partial solar cell processing steps are performed on the TFSS while it is still on the first carrier—the template. The choice of the second carrier is closely linked with whether partial or all process steps are completed on the template.

In the case of partial backside processing on the template, where upon after TFSS release both front-side cell processes as well as some back-side cell processes remain, several second carrier embodiments are possible.

In an embodiment referred to as Frontside reinforcement (FSR), the TFSS is released from the template using a temporary carrier attached on the partially processed backside. The temporary carrier is highlighted by its ease of release using means such as electricity (ex. mobile electrostatic chuck) or a temporary adhesive which is released upon heating at high temperature. Subsequently, the front side cell processes—such as texturization and passivation—are carried out with the temporary backside carrier supporting the TFSS. Finally the remaining backside steps are performed by transferring the TFSS from the temporary backside support to permanent front side reinforcement (ex. EVA/glass combination), thus freeing up the backside for processing. A specific requirement on the front side reinforcement being that it does not degrade light coupling beyond the degradation usually incurred due to module level packaging—making it possible to integrate the reinforcement into the solar module and thus permanent.

In a second embodiment referred to as backside reinforcement (BSR), the TFSS is released from the template (the first carrier) using a permanent backside reinforcement. The permanent backside reinforcement only partially covers the backside which allows processing on the backside through the open, uncovered backside areas after front side processes are completed. An example of this BSR is a grid design with a substantially large open area between the grids providing access to the backside for last several processing steps. Another example of this BSR is a backside reinforcement with holes which provide access to the underlying metal which was deposited or patterned while TFSS was on the template.

A third embodiment is similar to the BSR in that it also is a permanent backside reinforcement, but the reinforcement has integrated structures which obviate the need for substantial further backside processing. Thus, nearly all process steps on the backside were finished, while the TFSS was on the template.

Figure 2:
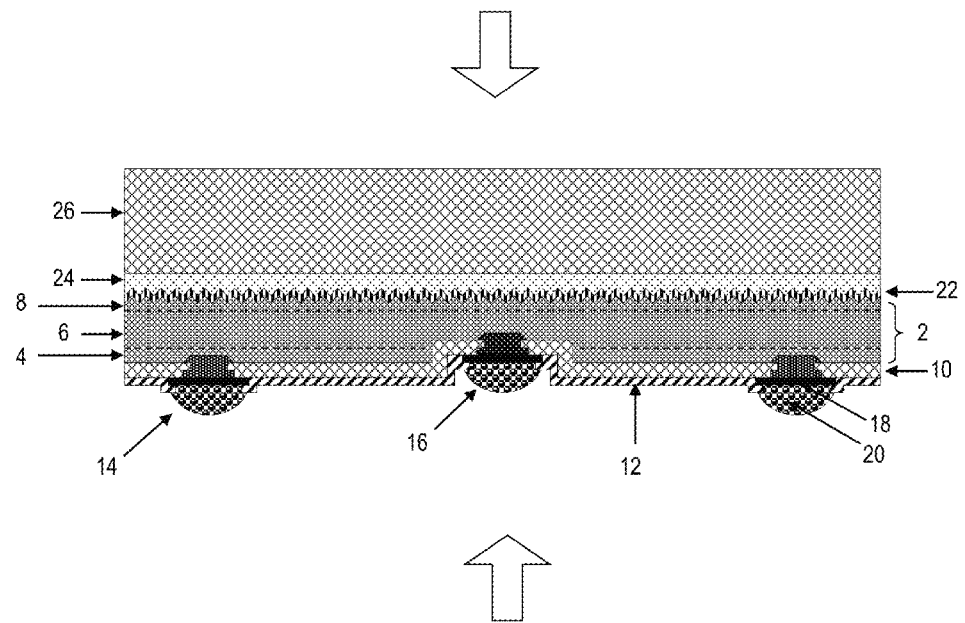
FIG. 2 is a cross sectional diagram of a back contact back junction thin film solar cell.

FIG. 2 is a cross sectional diagram of a back contact back junction thin film solar cell with front side reinforcement and separated junctions (this specific embodiment hereinafter referred to as an FSR-SJ cell) with an integrated lambertian mirror. The back contact back junction structure of this cell allows for increased conversion efficiency. Throughout this document, reference will be made to terms abutted (AJ) and separated (SJ) junctions. Abutted junction refers to the solar cell design where the local heavy base doping in silicon under the base contact directly abuts the emitter. Separated junction refers to the cases where the local heavy base region in silicon under the base contact is substantially isolated from the heavily doped emitter by the lightly doped base region. For the AJ and SJ classification only, the term 'junction' refers to the metallurgical junction formed when a certain concentration of doped region is next to a region of a different dopant concentration of same or different type. However, when reference is made to 'back junction', it is understood that this is an electrical junction formed by adjacent p+/n or n+/p regions.

As shown, this FSR-SJ cell utilizes epitaxial silicon substrate 2 comprised of emitter layer 4, base layer 6, and front surface field 8. The solar cell backside (or contact side) structure comprises: backside passivation dielectric 10, back mirror 12, selective emitter contact 14, base contact 16, seed metal deposition 18 (such as Al/Ag) on the base and emitter contacts, and plated metal 20 (such as Ni/Cu/Ni) on the Ag deposition. The solar cell frontside (or sunny side) structure comprises: textured front layer 22, and frontside reinforcement 26 attached by adhesive layer 24.

For example, in one specific embodiment, epitaxial silicon substrate 2 has n-type (phosphorous-based) base layer 6 and a p-type (boron-based) emitter layer 4—in practice, these polarities may be reverse. The epitaxial silicon substrate thickness has a specific range of values between 15 μm to 30 μm, but in general may be less than 100 μm. Front surface field (FSF) 8 is optional depending on the quality of the front surface recombination, base resistance, and the amount of Auger recombination.

The frontside (sunny side) of the fabricated solar cell is reinforced with a permanent planar carrier (frontside reinforcement 26). Because the carrier is permanent the material must be transparent, such as PV-grade glass or polymer which are preferred but not required. Shown, the thickness of the carrier is in the range of 0.2 mm to 2 mm. The front side reinforcement, which may be called frontside reinforcement/plate/carrier is mounted on the solar cell substrate using a thin layer of adhesive (shown as adhesive layer 24) such as PV-grade EVA, Z68, or silicone.

The front side silicon surface is textured with the texture size much smaller than the epitaxial thickness (shown as textured front layer 22), the texturing in this case leaving the silicon substrate substantially planar. The textured front side also has an anti-reflection coating such as PECVD SiN. PECVD SiHxNy:H may be on top of a thermal oxide or directly on top of the silicon substrate (shown as epitaxial silicon substrate 2). SiHxNy:H also serves the very important function of providing high positive fixed charge density—which may be in the range of $4\times10^{12}$ cm$^{-2}$. For an n-type base and p-type emitter solar cell, the positive fixed charge reflects the minority carrier (holes) away from the surface and prevents them from recombining at the surface which improves efficiency.

This diagram shows a back contact back junction solar cell structure where both contact polarities of metal (to n-type and to p-type regions) representing the base and the emitter of the solar cell for extracting electrical current or power from the solar cell are on the back side. Advantages of a back contact back junction solar cell have been detailed by others and includes: a) having no metal on the sunny side thereby eliminating metal reflection/shading induced efficiency loss, b) the potentially lower resistance of the metal interconnect lines as they may be made wider without a metal reflection penalty, c) better blue response because there is no high doping emitter area in the frontside of the cell where the blue light is absorbed, d) easier to connect and put together the completed cell in a module, and e) better aesthetics—for example the cell may be engineered to be completely black on the front side (Sunnyside).

The solar structure shown in FIG. 2 is also characterized by selective base contacts, shown as base contacts 16. Selective base contact refers to a solar cell design where base contacts are made to local, heavily diffused base doping areas in silicon. This is in contrast with non-selective base contacts, where base contacts are made to lightly doped (local or non-local) base diffusions. Selective base contacts, along with minimum contact areas, are an important efficiency booster because they help minimize the recombination of the minority carrier at the silicon to metal interface, which increases open circuit voltage. In addition to minimizing the base contact, the emitter contact is also minimized (shown as selective emitter contact 14). The smaller emitter contact areas also help minimize contact recombination at the metal to silicon interface, thus improving efficiency through improvement in the open circuit voltage (Voc).

Back mirror 12 shown as a patterned reflective layer as an example, is another feature advantage of this cell. Optionally, the back mirror may also be formed by the presence of metal on top of backside passivation dielectric 10. Thermal oxide is an example of a passivation dielectric which may be used in the present embodiment. However, other good passivating dielectrics such as, but not limited to, SiHxNy:H and $Al_2O_3$ may be used. Because of interference effects, a controlled passivation layer thickness under the back metal significantly improves the net reflectivity of the back mirror stack. The effectiveness of the back mirror may be defined by two attributes: its net reflectivity and the degree to which it is capable of diffusing the reflected light—high reflectivity and high diffusivity are desirable. Metal such as Al or Ag on top of a dielectric of optimum thickness (~1000A oxide) can give high reflectivity in the range of 95% while surface roughness and other techniques may be used to create a diffuse (lambertian) mirror. It is potentially advantageous to have a high metal coverage on the cell backside (greater than 85% as an example) to ensure most of the light falls on the back mirror. Because a larger part of the solar spectrum and wavelengths fall on the back mirror as the solar cell gets thinner, reliance of high efficiency on a good quality back mirror is even more critical for thin silicon. Process flows in this disclosure outline manufacturing methods which yield high metal coverage with desirable mirror properties.

The two features of the cell shown in FIG. 2 which distinguish it from the other embodiments of back contact back junction thin film silicon solar cells in this disclosure are separated junctions and front side reinforcement. The separated junction attribute refers to the fact the $n^{++}$ region where the base contact is made is substantially isolated from the $p^+$ emitter layer. This separation mitigates the risk of shunting in the solar cell and allows high fill factor (FF), which in turn helps achieve highest possible efficiencies. Additionally, separated junctions allow high reverse breakdown voltage.

The thin dimensions of the back contact back junction solar cell structures of this disclosure requires that the cell is never processed in the manufacturing line without reinforcement. Frontside reinforcement 26 in FIG. 2 is an example of a permanent frontside reinforcement that is part of the manufacturing process and also may be later utilized in a solar module. A key advantage of a permanent transparent frontside reinforcement is that it does not need to be removed because it is made of index matched material (such as PV grade EVA and glass) which does not compromise light coupling from the front side. Often, these materials are put on top of the cell during module assembly.

Figure 3:
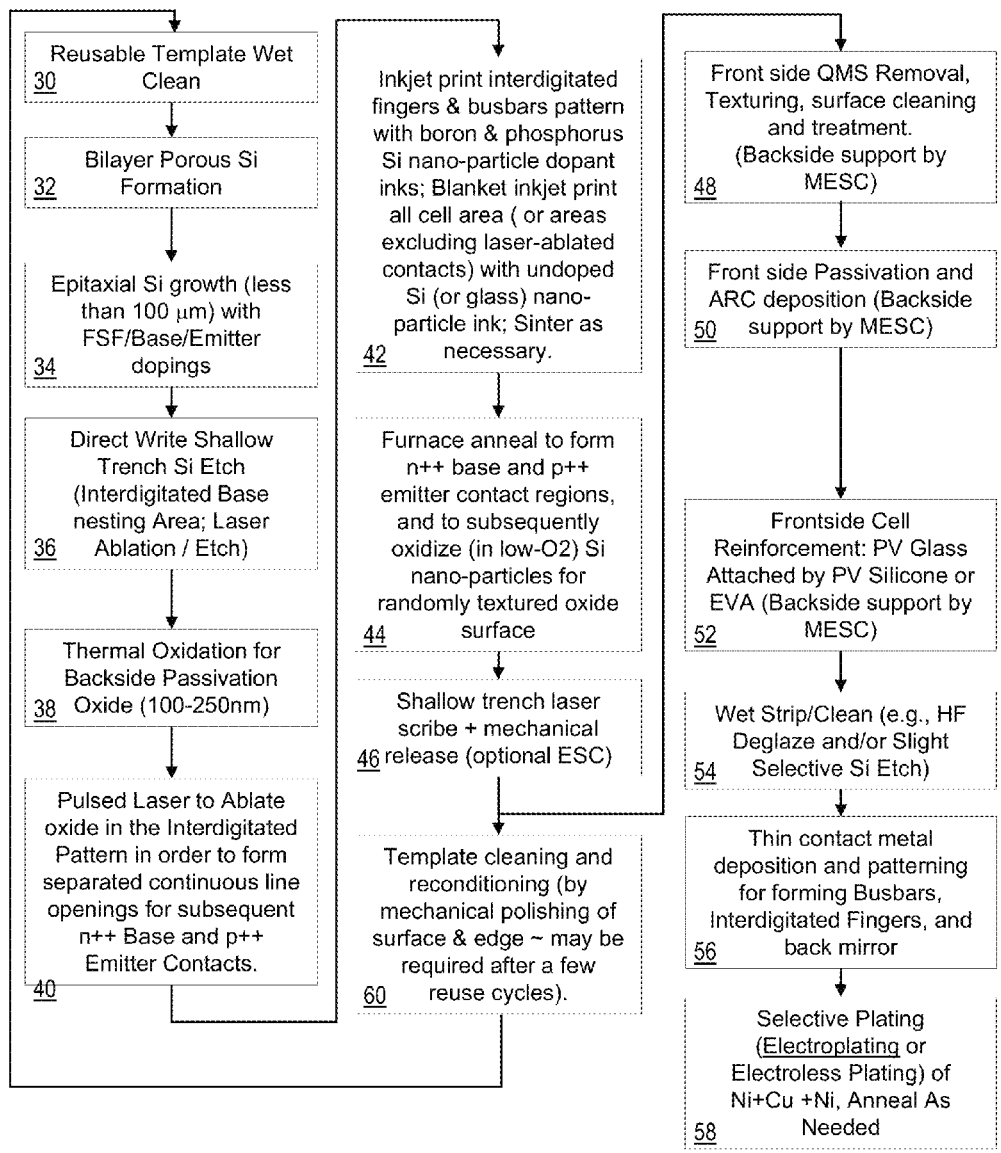
FIG. 3 is a process flow showing a fabrication process for making a back contact back junction thin film solar cell.

FIG. 3 is a process flow showing a fabrication process for making a back contact back junction thin film solar cell FSR-SJ. FIGS. 4A through 4k are cross sectional diagrams of the solar cell after key fabrication process steps as it is manufactured according to the fabrication process of FIG. 3. The structural features depicted in the cross sectional diagrams of FIGS. 4A through 4K are consistent unless otherwise noted. In FIGS. 4A through 4G the cross-sectional diagrams of the solar cell show the cell with the frontside (sunnyside) facing downwards and backside (non-sunny/contact side) facing upwards to better illustrate processing steps. The cross sectional diagram orientation is adjusted in FIGS. 4H through 4k.

As shown in FIG. 3, the fabrication process starts at step 30 with a cleaning of a re-usable silicon template. In general, the starting template may be any shaped wafer, for example 8 inch round or 156 mm×156 mm pseudo square or full square, with doping concentration and type (n-type vs. p-type) such that it is conducive to forming porous silicon. The template may be the same area as the desired final thin film solar substrate (TFSS) or it may be oversized allowing for the suppression of detrimental edge effects on the performance of the solar cell. Further, it may be any combination of rough or polished on its two sides. In a specific embodiment, this may be an 8 inch round wafer with p-type doping in excess of $3\times10^{18}$ $cm^{-3}$ (which is known to form porous silicon). The re-usable template goes through a general cleaning process to take out any organic or metal impurities. In a specific case this can be achieved using the standard RCA clean consisting of an organic clean (referred to as SC1) and metal contaminations clean (referred to as SC2 clean). In another specific embodiment, the cleaning sequence employs an alkaline etching step which has a finite etch rate of silicon and which is used to remove surface contaminants—by etching or undercutting. Potassium-, sodium-, or other hydroxides (KOH, NaOH or other) may be used in this cleaning step. For metal removal, the use of HCl, HF or a combination thereof is effective and cost effective due to bath lifetimes over chemistries that employ peroxides.

Figure 4A:
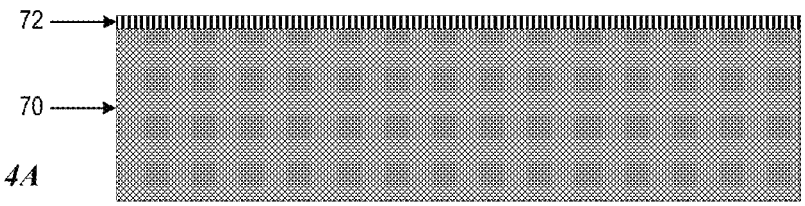
FIGS. 4A through 4k are cross sectional diagrams of a solar cell after key fabrication process steps as it is manufactured according to the fabrication process of FIG. 3.

Step 32 involves porous silicon formation by anodic etching. The template is subsequently put in a process tool which is capable of forming porous silicon on the flat surface in the front of the wafer. There are several ways of forming porous silicon, a specific process consists of using an anodic etch process with Hydrofluoric acid (HF) and Isopropyl alcohol (IPA) mixture. The anodic etch process chemically starts to etch away the silicon sporadically thereby forming a porous silicon at the surface. The reaction proceeds from the front surface and the thickness of the porous silicon increases with the time that the wafer is exposed to the process. FIG. 4A illustrates bi-layer porous silicon 72 formed on the top surface of re-usable silicon template 70. The characterization metric for this layer is its porosity. The porosity at the surface has to be low enough such that after a thermal reflow step immediately prior to epitaxial deposition, a single crystal silicon may be epitaxially grown on top of the porous material. On the other hand, the porosity has to be high enough such that the layer may be selectively removed while leaving the template and the epitaxial substrate unharmed. In one specific implementation, the aforementioned balance is achieved by tuning the porosity of a single layer. In a different implementation a multilayer stack with different porosities is used. In particular, a bilayer stack with the top layer on which silicon epitaxy is done has a low porosity—for example, but not limited to, 10-35% range—and the bottom layer in contact with the reusable template has a high porosity—for example, >40%—is desirable.

Step 34 entails the growth of the silicon layer on top of the porous silicon surface by an expitaxial process. A single crystal epitaxy (epi) is desirable. However, in general, the grown material may be multi or polycrystalline. An important figure of merit for this step is the quality of the material as measured by its minority carrier diffusion length. In general, the merit is dictated by the crystallinity (single crystal having the highest lifetime) and the contamination level (no metal, organic, and/or oxygen contamination desirable) in the film. The advantage of this approach is that while growing the epi, various diffusions and dopings integral to a solar cell may be done in-situ. Specific examples of these doping are base, emitter, and front and back surface fields. Depending on whether the base doping is n-type (such as phosphorous based) or p-type (such as boron based), the solar cell is referred to as NBLAC (n-type) or PBLAC (p-type), respectively. And the corresponding emitter will have an opposite polarity. Hence for NBLAC and PBLAC, the emitter will be p-type (such as boron based) and n-type (such as phosphorous based), respectively. Although NBLAC is used for descriptive purposes herein, PBLAC is an alternative embodiment fully within the scope of the disclosed process and structures. The base doping may be constant, or continuously varying or graded throughout the substrate thickness depending on what is needed to drive the efficiency up. One potential advantage of graded doping is that it produces a built-in electric field which in turn, allows minority carriers to drift quickly to the emitter where they are away from the danger of getting recombined—as opposed to relying entirely on the random diffusion process. In essence, this increases the effective diffusion length for a given lifetime of the material. The impact of an enhanced effective diffusion length is an increase in the short circuit current density (Jsc).

The solar cell designs presented in this document are back contacted back junction cells with the emitter on the backside. Backside (also the contact side or non-sunnyside) is defined as the side opposite to where the sun comes in—frontside (sunnyside) is opposite the backside and defined as the side where the sun comes in. Thus, the two defining features of back contact back junction solar cells are: 1) all metal connections are on the non-sunny side, and 2) the emitter is also on the non-sunnyside. In the embodiment described, the emitter is grown last in the epitaxial process to prevent its dopant profile from being affected by excessive thermal budget. This embodiment allows the backside processing to be done on the template as this side is the exposed side while on the template. For NBLAC the base doping may be achieved using phosphine (phosphorous imparting) gas in addition to silicon imparting (trichlorosilane—TCS) and other necessary gases, and when emitter growth is done toward the end of the epitaxial process the reactor may be programmed to switch to diborane (boron imparting) instead of phosphine. The thicknesses of the base and the emitter region should be optimized to give the best solar cell performance. In one embodiment, a base thickness less than 100 μm with doping between 5e14 and 1e17 cm−3 and an emitter thickness of less than 3 μm with doping between 1e18 and 3e20 cm−3 are preferred (the base thickness may be as thin as 15 to 30 μm). The emitter may also be multi-step with each step resulting in different concentration. This epitaxial structure can facilitate a high open circuit voltage (Voc) of the solar cell and thus a higher efficiency.

In another embodiment, the emitter is not grown in-situ as part of the epitaxial process, but rather ex-situ after the epitaxial deposition process. This can be accomplished among others by the deposition of a boron containing pre-cursor such as boron doped oxide, (BSG), deposited using atmospheric pressure chemical vapor deposition (APCVD), followed immediately or later in the process flow by a subsequent anneal that drives the emitter dopant in.

A front surface field (FSF) is optional. This consists of a heavier doping of the same kind as the base, grown epitaxially first on porous silicon before the base. For NBLAC this may be achieved using phosphorous doping. A front surface field, generally, has two advantages and a disadvantage. The first advantage is that an FSF shields the photogenerated, minority carriers from recombining at the front surface (where there is a lot of recombination) by reflecting them away from that surface through an electric field. The second advantage is that it helps mitigate the base resistance by providing a path for electrons to travel through a lower resistance area. The disadvantage stems from a larger recombination in the FSF area itself due to Auger recombination. In general, a good front passivation will obviate and a bad front passivation will necessitate the use of FSF.

Figure 4B:
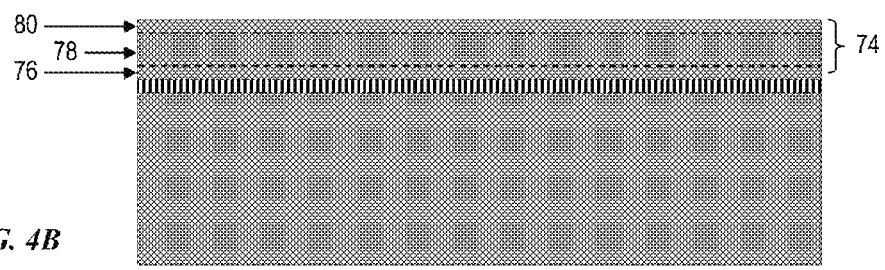
Figure 4C:
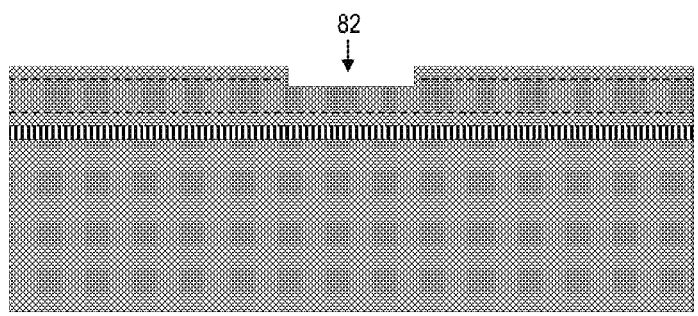

FIG. 4B illustrates epitaxial silicon substrate 74 comprised of n+ front surface field layer 76, n-type base 78, and in-situ doped thin p+ emitter layer 80. The n-type base epitaxial silicon layer is grown on the porous silicon surface of the re-usable silicon template.

As shown in FIG. 3, the step 36 is to form shallow trenches on the silicon surface by direct-write silicon etching or ablation. The shallow silicon trenches are henceforth referred to as trench isolation. The purpose of this etch is to nest the base finger and busbar areas and to isolate the base region from the emitter region, as is the defining characteristic of this particular separated junction (SJ) design, and to provide access to the base for base metal contact. In a different embodiment, the base metal fingers and/or the bus bars may not be nested. As shown in trench 82 in FIG. 4C, the depth of shallow trench should be such that it is deeper than the emitter layer thickness, such that the emitter is locally completely removed (shown as emitter layer 80 in FIG. 4B). In a specific embodiment if the emitter region is shallower than 0.5 m, the silicon etch depth may be between 0.5 to 1 μm. This etched trench pattern follows the same pattern as the base metal fingers and busbar, except it is wider to nest the actual metal finger and busbar areas, if nesting is required. In this embodiment, the base metal fingers and busbar are deposited within the shallow trenches without overlapping to the non-trenched emitter layer. The shallow trench width is preferred to be as small as possible. The motivation for keeping the trench widths small is that this width constitutes the extent of interruption in the emitter. Thus, wider trenches increase the chance of minority carriers to recombine under the trench area,—a phenomenon known as electrical shading.

In a preferred implementation, trench isolation may be performed using a direct write laser ablation of silicon or a direct etch using laser assisted halogen-based chemicals. Utilizing processes such as these is important because it uses all dry, in-line, non-contact processing, which avoids TFSS damage during on-template thermal processes. Further, a direct write laser etch or ablation process allows formation of the SJ architecture with only one additional process step compared to the abutted junction (AJ) architecture. For achieving the highest cell efficiency, it is desired that the silicon be ablated without any thermal damage to the silicon substrate, the so-called 'cold ablation' process. The 'cold ablation' of silicon is possible using low picoseconds or femtoseconds pulse width lasers. In cases where wet processing is acceptable, the trench isolation can also be done using patterning, followed by wet silicon etchants such as KOH. In another implementation the recess in silicon or the trench isolation may be done by screen printing etch paste which etches silicon. This implementation requires extra steps of firing the etch paste and cleaning the residue. However, a cleaning process using wet cleaning is less desirable on the TFSS, but may be made advantageous. In yet another implementation scheme, forming the silicon shallow trench may be achieved by first patterning a masking layer then performing silicon plasma or reactive ion etching (RIE). After the shallow trench etching, the patterned masking layer is removed and followed by a corresponding substrate cleaning step.

As shown in FIG. 3, the next step, step 38, is to deposit a protective dielectric layer. Dielectric layers include, but are not limited to, thermally grown $SiO_2$ and SiN. A general property of the dielectric layer is that it should be a good passivation layer. Further, the physical thickness of the dielectric layer is governed by a balance between two factors: (1) the layer should be thin enough so that it may easily patterned by the subsequent laser ablation step, and at the same time (2) the layer should be thick enough so that it is capable of blocking diffusion of gas phase dopant where it is not opened if such a dopant is used to form the junctions (as is the case for a non-selective emitter structure which is detailed later). Gas phase dopant diffusion is a subsequent fabrication step and will be detailed later. In a specific embodiment, this protective layer is thermally grown oxide with thickness in the range of 100 nm to 250 nm. The dielectric layer growth/deposition temperature and time may be selected to target an appropriate thickness. One consideration in picking the oxide growth conditions is to minimize the segregation of the boron emitter into the grown oxide. This requires minimizing the thermal budget of oxidation (favors a wet ambient process) and growing at an elevated temperature where less boron segregation is achieved.

Figure 4D:
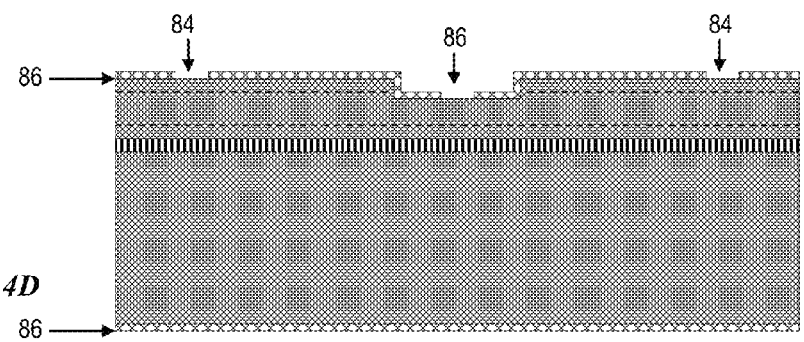

Then, in step 40, interdigitated contact openings in the aforementioned dielectric layer exposing the underlying silicon are formed. A pattern in which the dielectric will be opened is the inter-digitated fingers and bus bar, where the base and the emitter lines are separated and continuous. The specifics of the pattern as defined by standard dual bus bar or distributed bus bars will be detailed in ensuing discussion. The purpose of the base and emitter contact openings is for subsequent selective doping. In an NBLAC embodiment, base contact openings will be doped heavily with n-type phosphorous material and emitter contact openings will be doped with p-type boron. Both base and emitter opening regions are opened simultaneously in this step. A specific implementation of this step may be carried out using a direct laser ablation of the oxide layer. A pulsed picosecond laser in visible or UV wavelength is conducive to ablating an oxide layer. FIG. 4D illustrates emitter contact opening 84, base contact opening 86, and front and back side $SiO_2$ layer 86.

Figure 4E:
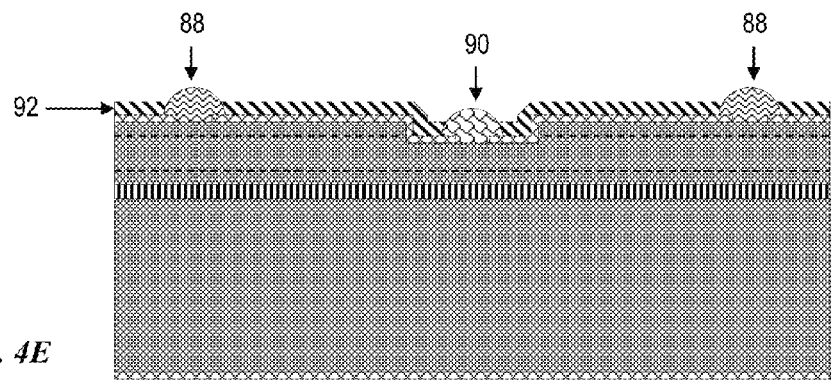

Step 42 involves applying both n-type and p-type dopants selectively over the base and the emitter contact open areas—following interdigitated pattern previously defined. The dopants should cover the openings and may have a slight overlap with the dielectric layer and/or go on top of it. For the NBLAC specific embodiment: on the emitter area this dopant has to be $p^{++}$ type (for instance boron) and on the base contact area it has to be $n^{++}$ type (phosphorous based). A specific method of implementation of the dopants is using the Inkjet printing technique. In addition, specific examples of the inks that may be deposited are silicon nano-particle based phosphorous and boron inks. This step is followed by an optional step of using inkjet printer to print all cell areas (or areas excluding laser-ablated contacts) with undoped Si (or glass) nano-particle ink. This is followed by sintering the ink as required by specific ink handling instructions. The purpose of the undoped ink is to use it to randomly texture the oxide surface—random texturing improves the Lambertian properties of the back mirror and will enhance cell efficiency (discussed subsequently). FIG. 4E illustrates inkjet-printed emitter dopant 88, inkjet-printed base dopant 90 (optionally sintered), and undoped inkjet-printed material 92 (nano-particles that form a blanket textured surface layer).

Figure 4F:
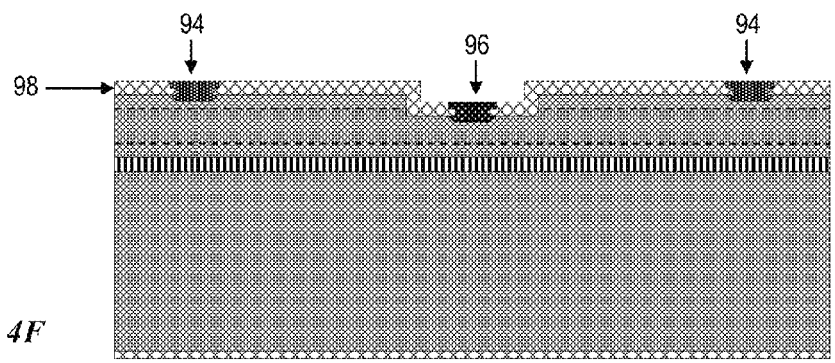

Then in step 44 the inkjet-printed boron, phosphorous, and undoped ink is annealed to form n++ and P++ emitter contact regions. Optionally, the annealing step may either be followed by or be integrated with another anneal in a low $O_2$ or steam environment, which serves to oxidize the undoped silicon particles and create randomly textured oxide surface. FIG. 4F illustrates P++ selective emitter region 94, n++ selective base region 96, and surface-textured silicon oxide layer ($SiO_2$) 98.

Figure 4G:
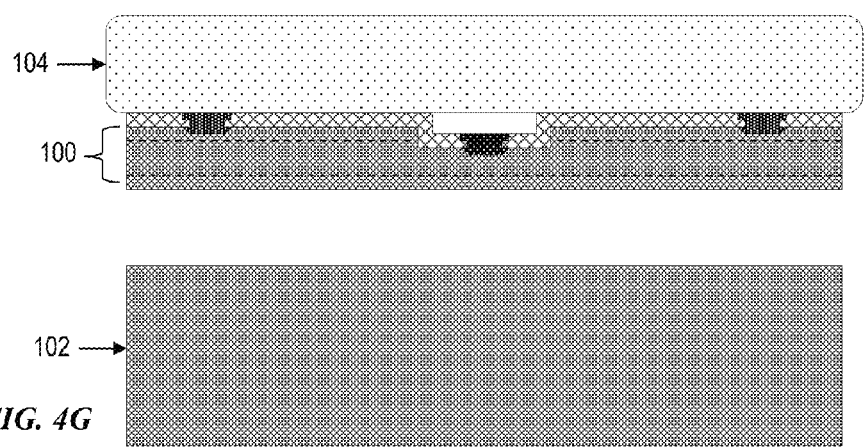

Then in step 46 the TFSS is separated from the reusable template using dry or wet separation or a combination of techniques. At this step the TFSS—with the aforementioned base and emitter patterns and doping—is separated from the reusable template. The removal occurs along the interface formed by the sacrificial porous silicon. In a specific embodiment, this is accomplished using a shallow trench laser scribe in a pattern conducive to the final shape of the solar cell. Amongst several possibilities this laser scribe may be 125 mm×125 mm or 156 mm×156 mm pseudo squares or oversized with respect to the final solar cell size. The laser scribe is subsequently followed by clamping on the base/emitter contact side and a mechanical release where it is pulled away from the template. The clamping may be performed using vacuum forces and assisted or accomplished by means of an electrostatic chuck (ESC) or a mobile electrostatic carrier (MESC). For descriptive purposes, an MESC is cited wherever a mobile carrier is employed. The separation of the TFSS from the template typically occurs at the highest porosity portion of the porous silicon layer. Optionally, after the separation, a final cutting procedure to size the TFSS may be performed. FIG. 4G illustrates a backside supported TFSS with the released process TFSS 100 separated from reusable template 102 and supported by temporary TFSS carrier (such as an MESC) 104.

Step 60 shows the template reconditioning and cleaning in preparation for another use. The epitaxially grown silicon outside the TFSS area on the template is removed and the template is sent back for another cycle of reuse defined by template clean, porous silicon, and epi growth. In a specific implementation the removal of the extraneous silicon may be performed using mechanical grinding/lapping or polishing—which may be performed on the top, along the edges, and on the backside of the template and serves to remove extraneous silicon where needed. These steps can be carried out with every re-use or once every several reuses.

At this point in the process the separating TFSS may be self-supporting if the thickness of the TFSS is greater than 75

μm. However, when the TFSS is thin—such as thinner than 50 μm—it should be supported. In a specific implementation, the mechanical clamping during the release step or after the release step is performed by a mobile ESC (MESC). The MESC subsequently latches on to the thin TFSS and, importantly, supports the thin TFSS as a temporary carrier on the cell backside (the non-sunny side where the base and emitter patterns exist). The frontside (sunny side) is now exposed.

Then in step 48, the frontside of the cell is cleaned and any remaining debris of porous silicon (henceforth referred to as quasi monocrystalline silicon or QMS) is removed. The clean may be performed using a single sided wet clean where the cleaning etchant only touches the TFSS frontside while TFSS is being held on the backside by the MESC. The backside of TFSS is protected from etching through the MESC, or equipment suitable for the application of single side etch processes are used. Amongst various wet cleaning options, HF/nitric acid, HNA, TMAH, and KOH based silicon etch may be used.

The QMS clean is followed by texturing of the front side surface. The texturing wet chemistry may be the same as QMS removal chemistry (for example, but not limited to, KOH), resulting in both tasks being accomplished in a single step. Alternatively, there may be a series of chemical treatments resulting in QMS removal and texturing. After texturing, the frontside surface of the substrate is treated. In one embodiment, the substrate undergoes several steps including a metal removal clean, typically using qualified acids or acid combinations such as hydrofluoric acid (HF) or hydrochloric acid (HCl). Optionally, an organic removal such as ozone is applied. In other embodiments, chemical oxides of good quality to enable a low density of surface states are employed as a last wet process step prior to deposition of the passivation layer—which in the case of silicon nitride may also be the anti-reflection layer (ARC).

Figure 4H:
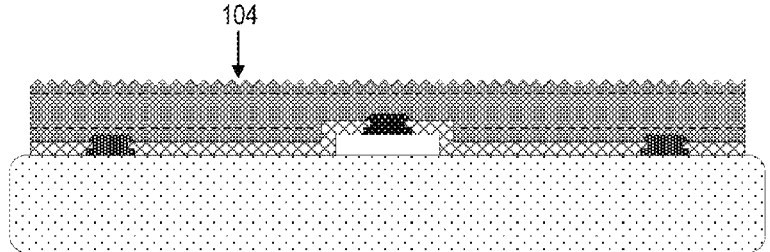

In FIGS. 4H through 4K the cross-sectional diagrams of the solar cell have been adjusted (turned 180°) to better illustrate subsequent processing steps. Accordingly, the cell is now depicted with the frontside (sunnyside) facing upwards and backside (non-sunny/contact side) facing downwards. FIG. 4H illustrates the backside supported TFSS with textured frontside surface 104.

One alternative embodiment which includes a slight variation of the process flow shown in FIGS. 4A through 4H occurs when the template is pre-textured. In this case, the substrate TFSS is still substantially planar, however, the released TFSS is already textured which obviates the need to perform wet texturing of the TFSS after QMS removal. The remaining of the process flow remains the same as discussed in FIG. 3 and all the design and process variations discussed in the context of previous flow remain applicable to the pre-textured TFSS embodiment.

Figure 4I:
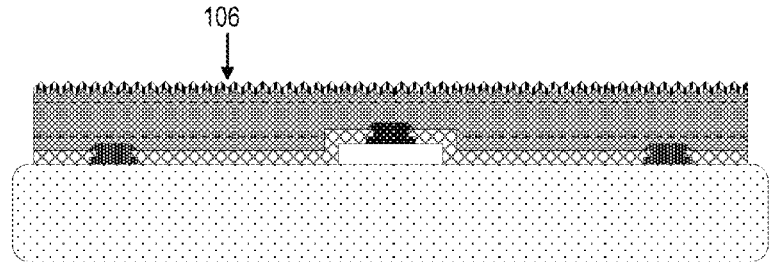

Next, in step 50 single-sided surface passivation and anti-reflection coating (ARC) is performed. In a specific embodiment this may be achieved using microwave plasma enhanced chemical growth of silicon nitride. In another embodiment, this may be a silicon dioxide layer followed by PECVD $SiH_xN_y$:H layer. In yet another embodiment, the passivation structure may be an amorphous silicon layer followed by silicon nitride. In each of the above embodiments, the deposition temperature may be tailored between 100 and 400 deg C. to match the need and capability of the material already in the cell stack. This passivation serves not only the critical function of reducing the surface recombination velocity on the cell frontside (which helps significantly boost efficiency of a back contacted cell), but also serves as an anti-reflection coating (ARC) which enables strong coupling of light into the solar cell. FIG. 4I illustrates the backside supported TFSS with frontside surface passivation and anti-reflective coating (ARC) layer 106.

Figure 4J:
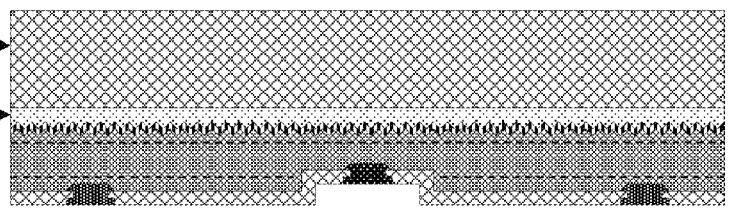

As shown in FIG. 3, in step 52 the temporary backside support is converted to a permanent front side reinforcement. With the passivation/ARC layer created on the frontside (sunnyside), only backside processing of the back contact back junction cell remains. A specific implementation of this frontside reinforcement is to use thin PV glass attached by PV Silicone, Z68 or EVA material. An advantage of reinforcing the front side with this material is that this reinforcement can be permanent because when the solar cell is packaged into a module, this same material often goes on the frontside of the cell. Thus, this type of reinforcement ensures that there is no degradation of optical performance of the finished module. Once this front side reinforcement is complete, the temporary backside support, such as the MESC, is released through electrostatic discharge action and the cell backside (non-sunny side) is available for final metallization processes. It is important to note that at no point during the support conversion is the TFSS not supported/reinforced. FIG. 4J illustrates the permanent frontside reinforcement 108 (using a material such as glass) and reinforcement attachment layer 110 (using materials such as PV-grade EVA or silicon to attach the frontside reinforcement).

In step 54 the frontside of the reinforced TFSS is cleaned to remove the dopant residue (such as from the Inkjet) and clean the contact areas for a good metal adhesion and electrical contact. The cleaning etchant may be HF to remove the dopant residue and surface oxide and/or a mild selective silicon etch to clean the area. In another embodiment, the process residue from the inkjet can be removed by dry techniques such as pulsed laser etching, thereby exposing the underlying silicon for contact formation. This laser process can also be performed right after the dopant diffusion when the TFSS is still on the template carrier.

Figure 4K:
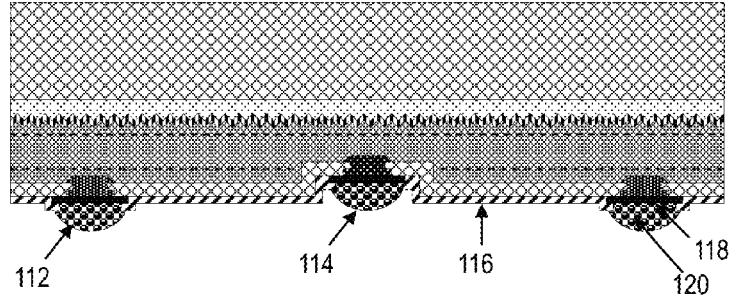

Step 56 involves metallization. And although there are several ways to perform metallization, a specific implementation with a few variations is described. After cleaning, Silver (Ag) or aluminum (Al) nano particle ink is selectively deposited on top of both the base and the emitter contact areas. The ink is deposited such that it follows the shape of the emitter and the base fingers and busbars. However, the ink deposition is optionally much wider than the respective finger and busbar widths to create a full area back mirror. This metal coverage may be >85% to ensure that most of the light on the back falls on metal and is then reflected back into the structure for more absorption passes. Care must be taken to ensure that metals from the opposite polarity do not touch each other. In an alternative embodiment, the same final structure may be achieved using blanket Al deposition (by using evaporation or PVD, for example) and laser ablating the Al deposition to form the gap areas. In yet another alternative embodiment, metallization occurs by depositing Ag or Al ink to both the base and emitter contact areas and forming continuous metal fingers and busbars. After sintering the ink, electroplating steps are conducted by using the metal layer as the electroplating seed layer. For the case of Al ink, a second ink can optionally be applied in similar fashion prior to electroplating. The purpose of the added electroplating steps is to provide increased electrical conductivity in a cost-effective manner. As an example, a metal stack of nickel/copper/nickel (Ni/Cu/Ni) with Cu thickness in the range of 10 to 50 μm may be electroplated. The thin Ni layer under the Cu serves as a Cu barrier to prevent its diffusion into silicon, while the Ni layer on top of the Cu layer serves as a passivation layer to prevent Cu surface oxidation and corrosion. In yet another alternative embodiment, instead of forming the back mirror by using the described Ag ink metallization or through an evaporated/PVD Al layer, a reflective insulating layer such as inkjet-printed may be deposited to serve as the back mirror. Using this approach, metal on the base side and on the emitter side remain isolated from each other and potential electrical shunting through the underlying dielectric layer is avoided. FIG. 4K illustrates the fabricated back contact back junction solar cell with selective emitter contact 112, base contact 114, inkjet-printed patterned reflective layer 116, plated metal 120 (such as Ni/Cu/Ni), and seed metal deposition 118 (such as inkjet-printed Ag and depicted in the diagram as the black region positioned between plated metal 120 and P++selective emitter region 94).

Figure 5:
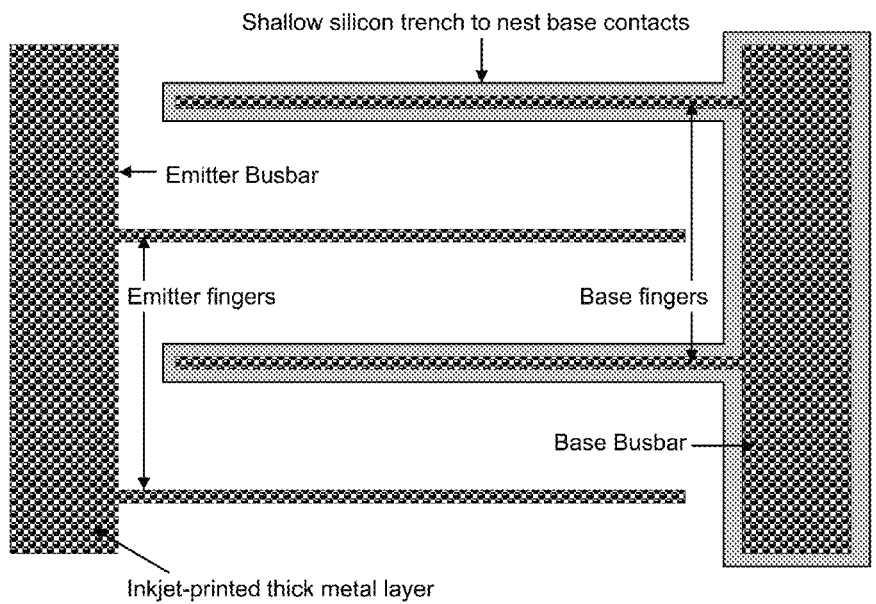
FIG. 5 is a diagram highlighting back contact interdigitated emitter and base metal fingers and busbars of the solar cell.

FIG. 5 is a diagram showing the backside (non-sunnyside) of a back contact solar cell (NBLAC or PBLAC) highlighting the back contact interdigitated emitter and base metal fingers and busbars of the solar cell. The inter-digitated finger and busbar pattern is shown as an example and other patterns are possible. The shallow silicon trench region is positioned under the base metal fingers and busbar. As previously described, the trench depth is slightly deeper than the emitter layer thickness. The trench width should be minimized so that electrical shading may be kept at a minimum. In this particular embodiment, the metal patterns are formed by inkjet printing, such as inkjet printing of Ag or Al inks followed by a sintering process at an elevated temperature. Also in the embodiment shown, the back mirror is formed by a reflective dielectric layer. As shown in FIG. 2 and FIG. 4K the base metal layer does not overlap with the emitter regions and as a result, potential electrical shunting across the backside surface passivation layer is avoided. However, as a tradeoff, the thickness of the metal layer should be thick (thicker than 50 µm in some instances) so that the metal layer could handle the electrical current and power extraction requirement of the solar cell. For the particular interdigitated fingers and busbar design shown in FIG. 5, the length of the interdigitated fingers may equivalent to the width of the solar cells themselves, close to 125 mm or 156 mm long in some instances. The width of the metal fingers may be in the range of 100 µm to 500 µm and the pitch between adjacent metal fingers in the range of 0.5 mm to 3 mm.

FIGS. 6A through 6D are diagrams showing the backside of a back contact BLAC solar cell highlighting an alternative metallization pattern of base and emitter contact openings after key fabrication steps. FIGS. 7A through 7D are cross sectional diagrams of the solar cell illustrating the metallization embodiment of FIGS. 6A through 6D. In this embodiment, the starting TFSS (a front side reinforcement with separated junctions cell) for metallization corresponds to the cell shown in FIG. 4J.

Figure 6A:
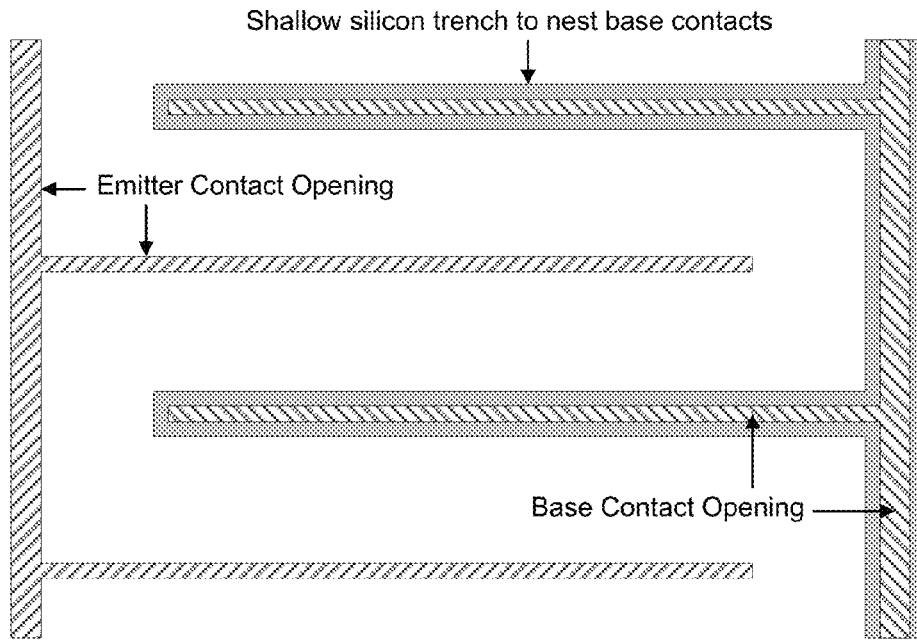
FIGS. 6A through 6D are diagrams showing the backside of a back contact solar cell after key fabrication steps.
Figure 7A:
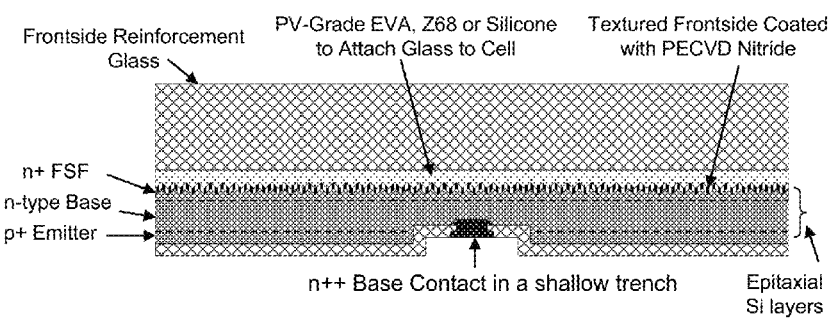
FIGS. 7A through 7D are cross sectional diagrams of the solar cell corresponding to the embodiment of FIGS. 6A through 6D.

FIG. 6A illustrates the top view of the emitter and base contact openings with the base contact opening nested in a shallow silicon trench. Corresponding FIG. 7A illustrates the cross-sectional view of the base contact region (emitter region omitted to simplify the drawing). The emitter contact is similar except that it is positioned on the emitter surface rather than in the shallow silicon trench where the base contact is positioned.

Figure 6B:
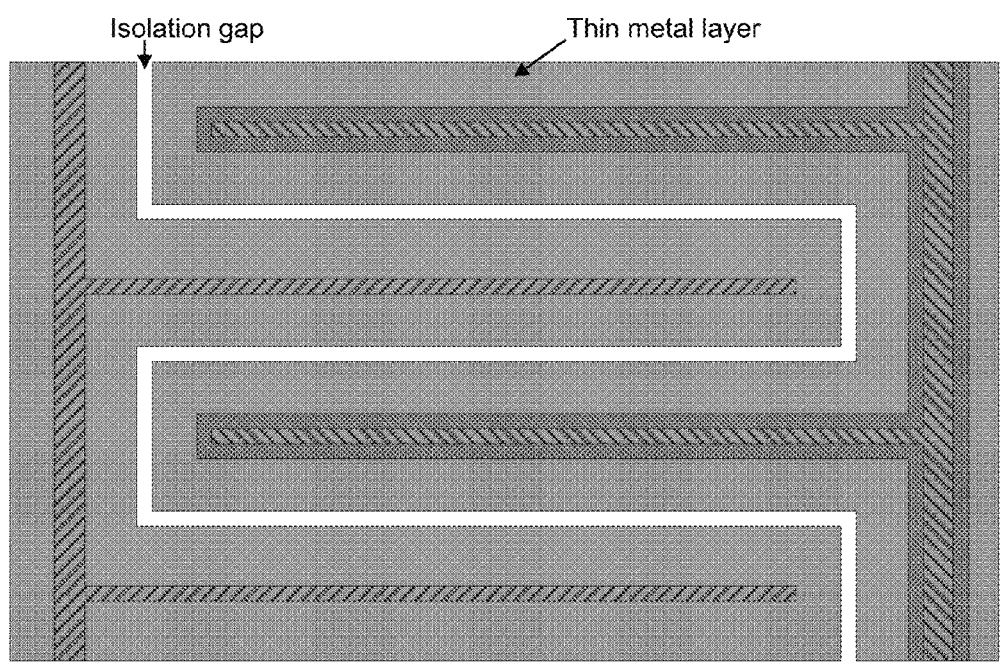
Figure 7B:
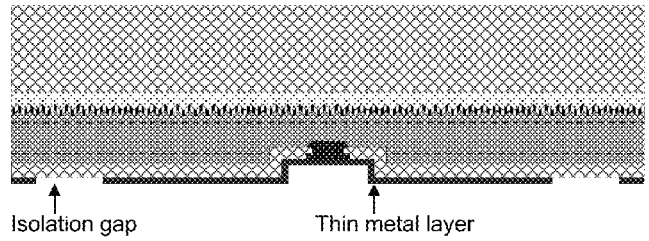

FIG. 6B and corresponding FIG. 7B illustrate at least one deposited thin metal layer with a narrow isolation gap to separate base and emitter metal regions. The thin metal layer serves two purposes: 1) to provide an electroplating seed layer for subsequent thick metal stack plating, and 2) to provide the back mirror. The thin metal layer may be deposited by metal inkjet printing (such as Ag or Al ink) followed by sintering. In this direct-write process, the metal isolation gap is formed as printed therefore no extra thin metal patterning step is needed. In an alternative method, the thin metal is blanket deposited by metal (such as Al or a stack of Al/NiV/Sn) evaporation or PVD. Next, forming the metal gap may be achieved by direct laser ablation with controlled ablation depth so that the laser power does not damage the silicon surface under the narrow isolation gap. Alternatively, a masking layer may be screen printed on the Al back mirror surface followed by a chemical etching of the exposed thin Al layer to create the narrow isolation gap. The etching masking layer is then removed after Al etching.

Figure 6C:
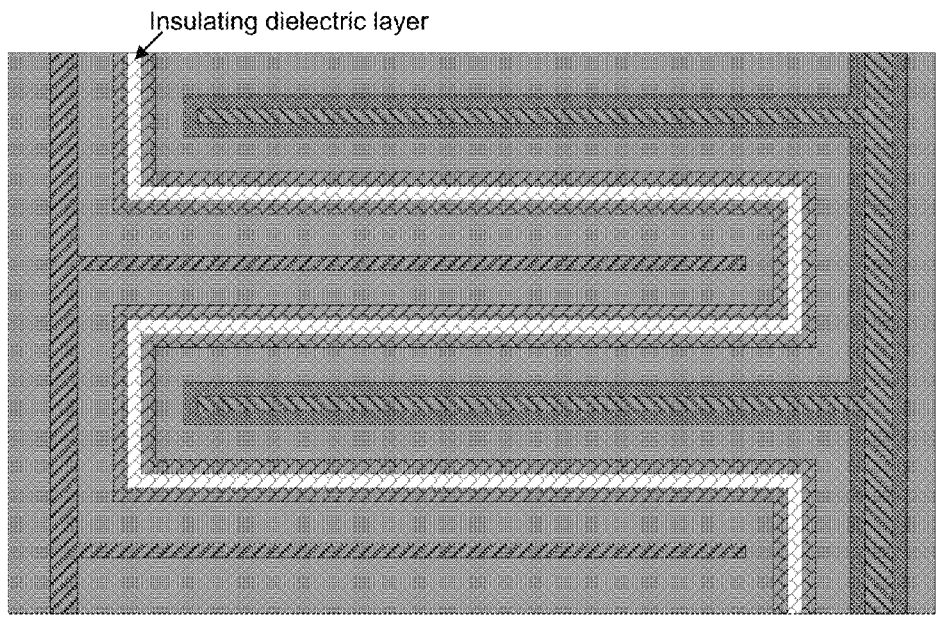
Figure 7C:
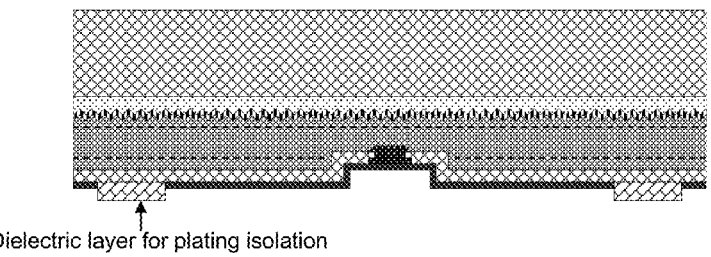

As shown in FIG. 6C and corresponding FIG. 7C, the next step is to deposit an insulator material (a dielectric layer) covering the gap areas. The dielectric material may overlap slightly with the thin metal on both sides (as depicted in FIG. 6C). The utility of this dielectric layer includes acting as a protection layer from the subsequent plating step—if there are any cracks, scratches or undesirable defects in the underlying oxide layer between the metal lines (these can be created by handling and the process steps post oxidation), plating being a wet process will plate in these defects thus connecting and shunting the two metal lines. Depositing a dielectric layer in the gaps ensures that any defects are plugged and there is no undesirable plating. The dielectric insulating layer may be applied through an inkjet print, screen print, or blanket deposition.

Figure 6D:
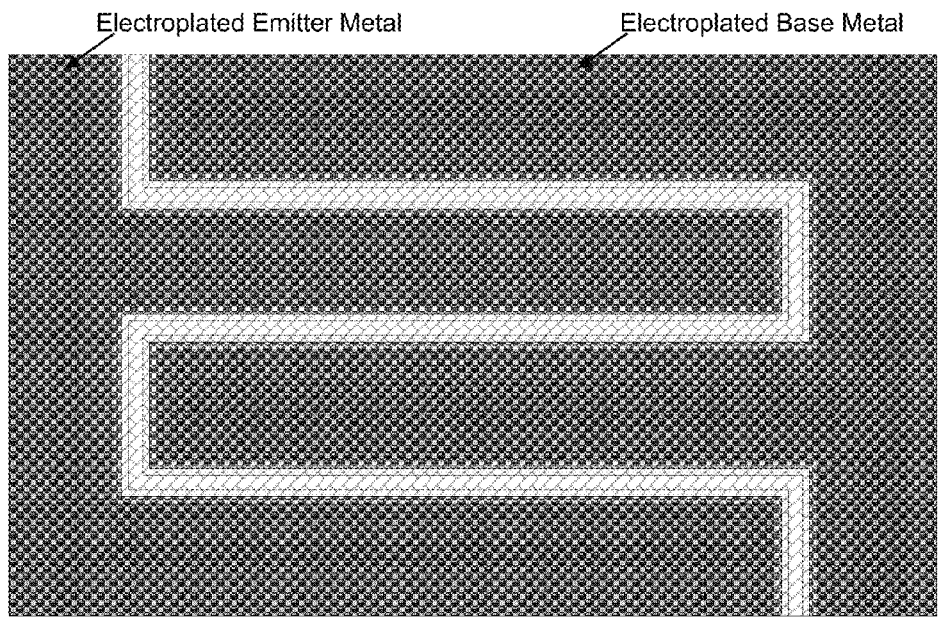
Figure 7D:
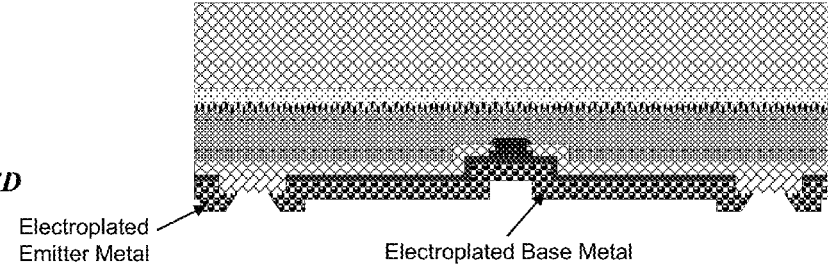

As shown in FIG. 6D and corresponding FIG. 7D, the next step in metallization is to plate metal selectively on top of the patterned thin metal layer. A specific embodiment includes a Ni/Cu/Ni stack. Ni serves as a barrier to Cu, while Cu may be as thick as needed to ensure a low resistance and a good Fill-Factor. The metal layer's thickness depends on the busbar design. Other metals such as Ag (although expensive) are also possible. A preferred method of plating is electroplating which ensures selective plating only on the underlying conductive areas—thus preventing shunt. The metallization sequence shown here completes the entire cell flow, but may be followed by an optional forming gas anneal to improve open circuit voltage (Voc).

Figure 8A:
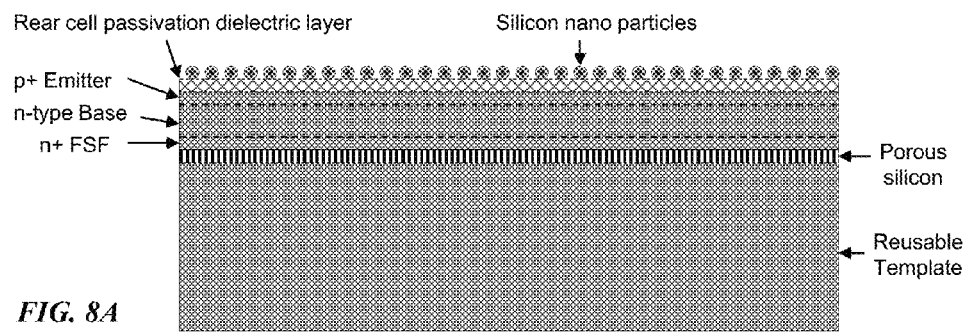
FIGS. 8A through 8C are cross-sectional diagrams of a solar cell showing the formation of a Lambertian mirror.
Figure 8B:
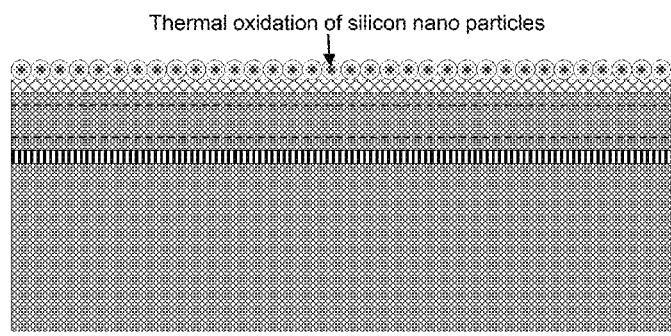
Figure 8C:
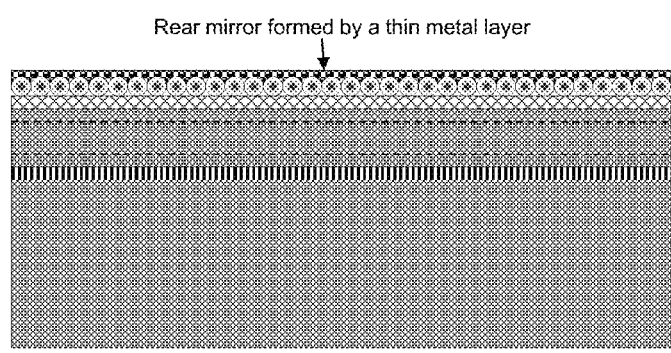

FIGS. 8A through 8C are cross-sectional diagrams of the solar cell showing the formation of a Lambertian mirror after key fabrication steps. The term "Lambertian" refers to the quality of the back mirror by which it is able to diffuse the reflected light in all directions—as opposed to specular reflection where light retains the memory of its incidence angle and is reflected at an angle equal to the incidence angle. The diffuse or Lambertian reflector has the advantage that it increases the path length for light giving light more interaction distance with silicon for absorption before the light reaches the opposite side of the cell. This attribute is especially critical for very thin solar cells ranging from 15-30 µm because for thin solar cells even shorter wavelengths of light will hit the back mirror. In addition, it has been shown with simulations that using a Lambertian mirror gives the solar cell a high efficiency which is more immune to lifetime variations—an attribute that provides a major binning advantage in manufacturing. Two methods of making a Lambertian mirror integrated with the previously disclosed process flow are provided. In the first implementation, the cell is textured on the backside prior to oxidation, using silicon etch texturing for example. This is followed by deposition of rear metallic reflector (such as Al or Ag) using inkjet printing of metallic nano-particle ink or PVD of metal (Al or Ag). A potential consideration of this method includes possible emitter shorts due to texturing etch punching through the emitter junction area. In addition, it might potentially increase the backside surface recombination velocity resulting in a higher emitter dark current density and poor Voc.

Another method of making a Lambertian mirror (diffuse mirror) was implicitly disclosed in the above process flow and shown in FIGS. 8A through 8C. The method is to texture the backside passivation dielectric (e.g. thermal oxide) by inkjet printing of, preferably undoped, silicon nano-particle ink followed by sintering and oxidizing to form a textured, rough backside surface. FIG. 8A shows the deposited silicon nano-particles on the rear cell passivation dielectric layer. The passivation dielectric may be a thin layer of thermal oxide with a thickness in the range of 100 nm to 250 nm. FIG. 8B shows the cell after the thermal oxidation of the silicon nano-particles. Alternatively, the backside may be coated by ink-jetting glass (quartz) nano-particles as well. Subsequently, as shown in FIG. 8C, the backside diffuse mirror formation is completed by inkjet printing of metallic nano-particle ink or PVD of metal (Al or Ag). This method of forming a Lambertian (diffuse mirror) occurs before the TFSS release.

FIGS. 9A and 9B are diagrams illustrating two metal busbar designs in accordance with the disclosed subject matter. An important attribute of a thin, yet high efficiency cell design is the busbar design. The standard busbar design, shown in FIG. 9A, is a dual bus bar design with inter-digitated metal pattern and may be used with the disclosed back contact cells. However, this design may require thick metal in the back because the current has to be carried by the fingers all the way from one edge of the TFSS to the other. The line presents a large resistive loss of power. A thicker metal typically in the less 30 μm range is applicable for a standard silicon cell which is greater than 150 μm thick. However, thin silicon (15 μm to 50 μm) back contacted solar cells, such as those in this document may not be able to withstand the stresses of less than 30 μm thick Cu metal lines.

FIG. 9B illustrates an alternative distributed busbar design for a very high efficiency, thin, back contacted cell. In this embodiment, there are N bus bars for emitter regions and the same number for the base regions. An advantage of this design is that the thinner fingers are responsible for carrying the current for a much shorter distance—dramatically mitigating the resistive losses. All the emitter busbars are connected together and the base busbars are connected together. Compared to the standard N=1 (dual busbar), for N pairs of busbars the busbar current is reduced by a factor of N. This allows the Cu thickness to be reduced by a factor of N without compromising the resistive losses—enabling Cu thickness between 5-10 μm for N=3 (an N=3 embodiment is shown in FIG. 9B) and N=4. For thin silicon cells this is a major advantage. However, one potential issue with distributed bus bars may be increased contact recombination and electrical shading because of a larger thickness metal. This may be mitigated by making a slotted busbar design in which the contact to underlying silicon is in slots, but the overhanging metal joins together to form a continuous line. This method requires that the spacing between the slots is no more than twice the thickness of the metal. Note that the busbar design is decoupled from the process flow discussed above as it only dictates the pattern in which the laser ablates the dielectric and the thin metal layer.

Figure 10:
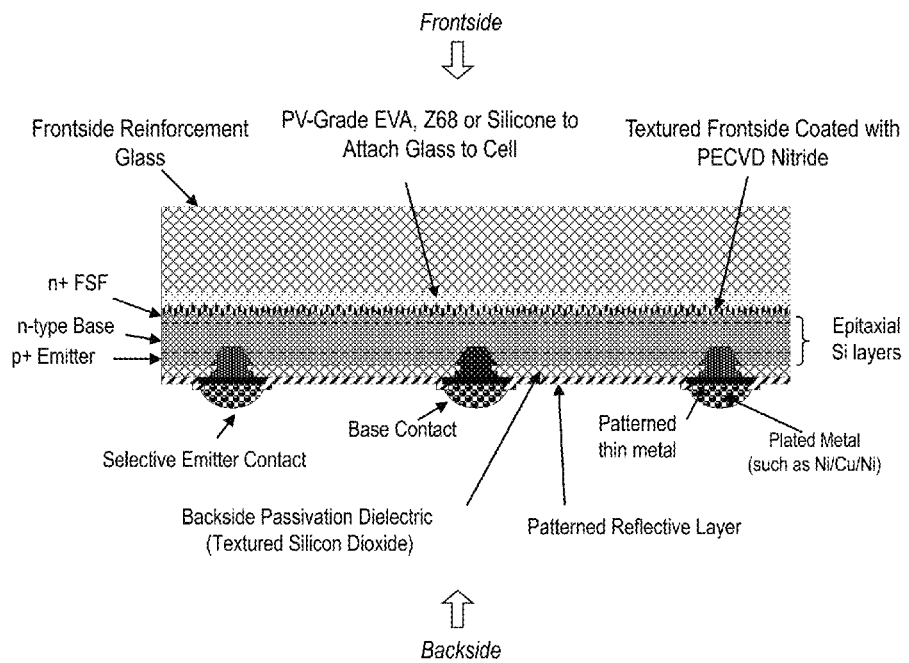
FIG. 10 is a cross sectional diagram of a back contact back junction thin film solar cell with front side reinforcement and abutted junctions.

FIG. 10 is a cross sectional diagram of a back contact back junction thin film solar cell with front side reinforcement and abutted junctions (this specific embodiment hereinafter referred to as an FSR-AJ cell) and integrated lambertian mirror in accordance with the disclosed subject matter. In this embodiment, the base and emitter junctions are abutted because there was no a pre-fabricated shallow silicon trench to nest the base junctions and contacts. As a result, the base contact doping has to be strong enough such that it overcomes and counter-dopes the underlying and already existing emitter layer under it.

Figure 11:
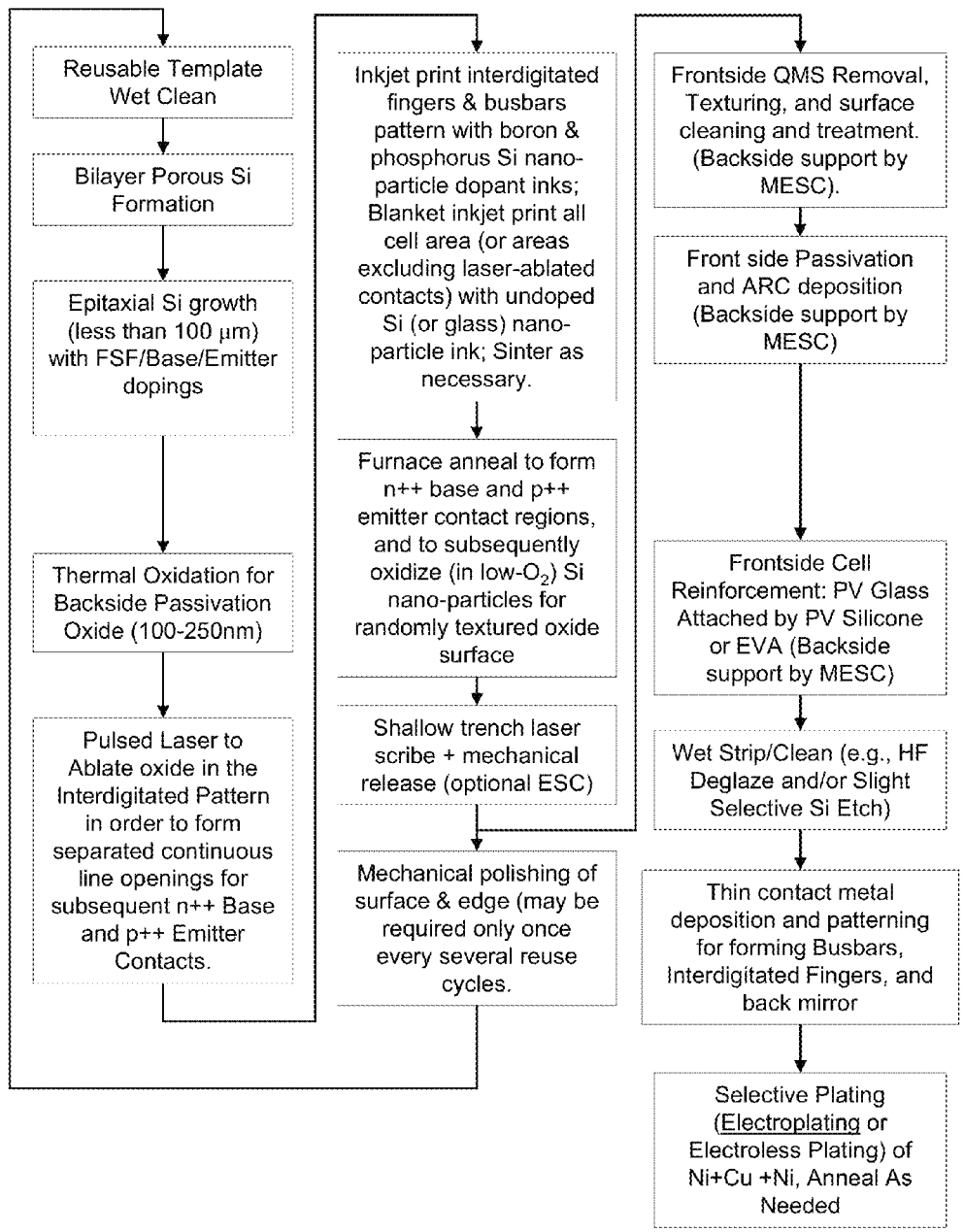
FIG. 11 is a process flow showing a fabrication process for making the cell of FIG. 10.
Figure 12A:
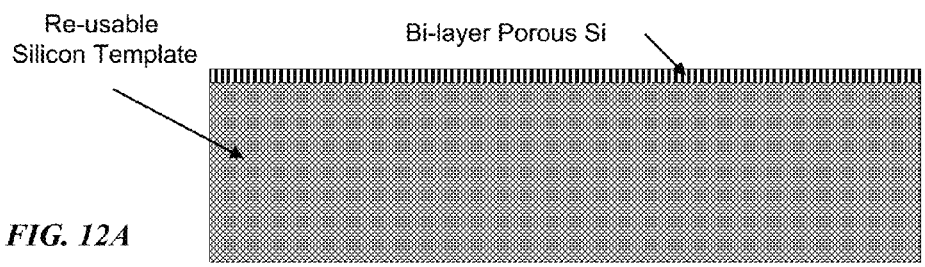
Figure 12B:
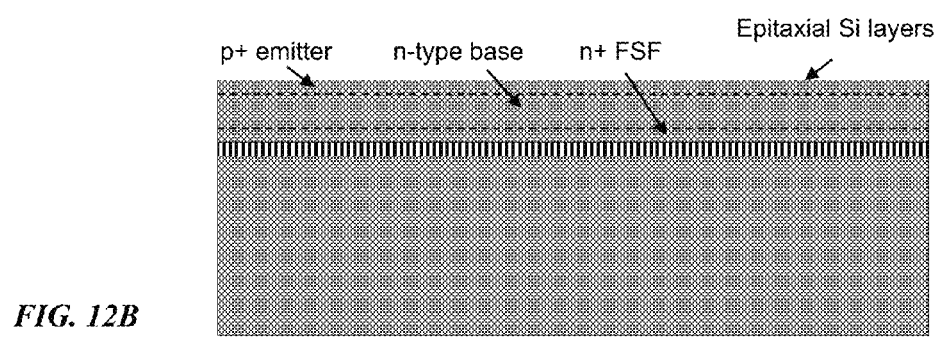
Figure 12C:
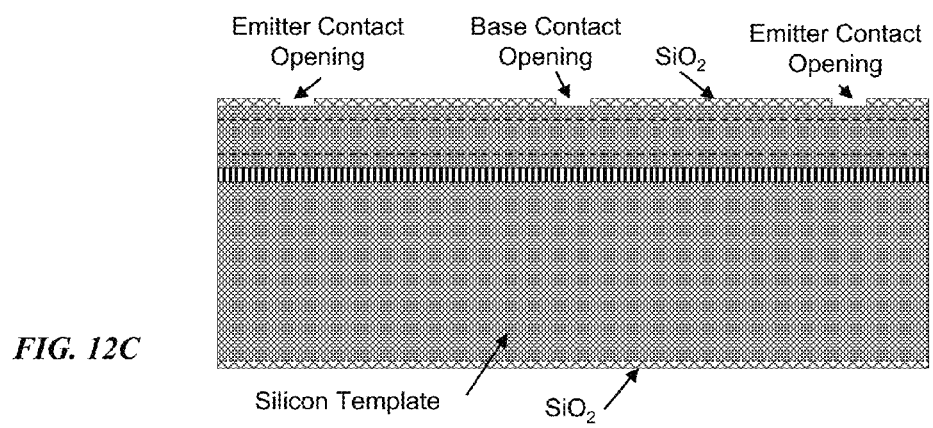
Figure 12G:
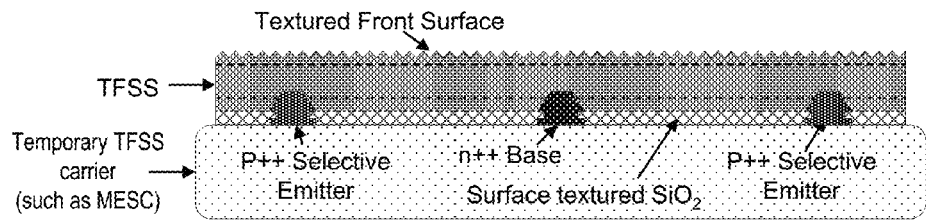
Figure 12H:
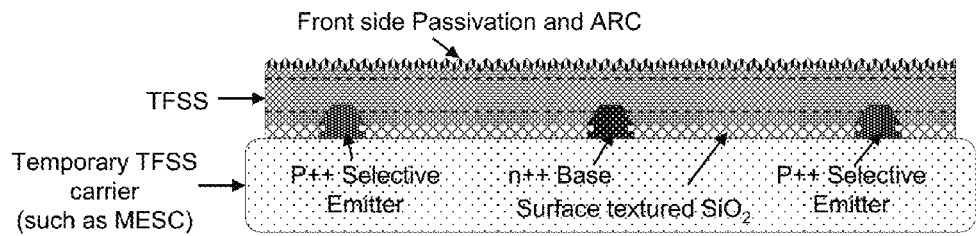
Figure 12I:
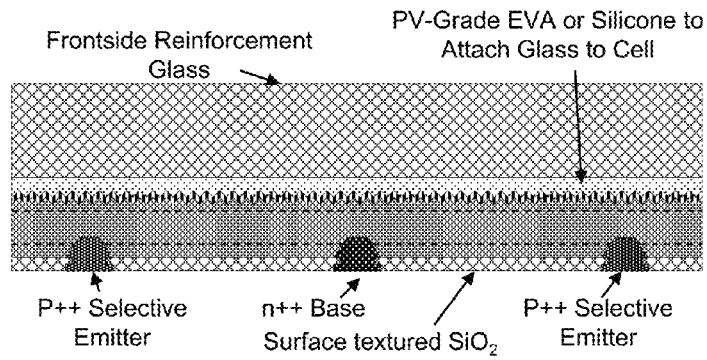
Figure 12J:
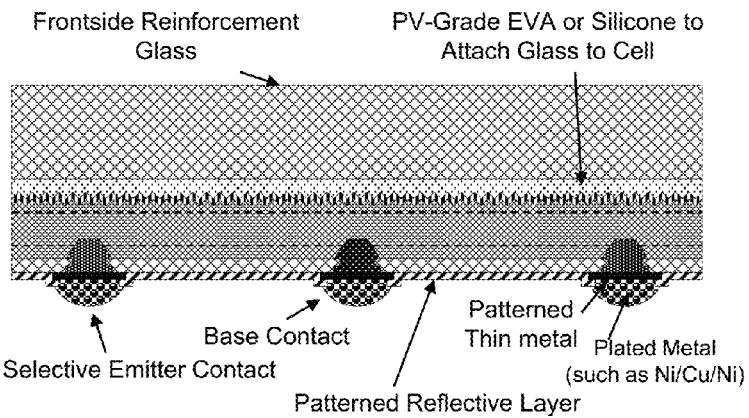

FIG. 11 is a process flow showing a fabrication process for making a back contact back junction thin film solar cell FSR-AJ. FIGS. 12A through 12J are cross sectional diagrams of the solar cell after key fabrication process steps as it is manufactured according to the fabrication process of FIG. 11. The structural features depicted in the cross sectional diagrams of FIGS. 12A through 12J are consistent unless otherwise noted. In FIGS. 12A through 12G the cross-sectional diagrams of the solar cell show the cell with the frontside (sunnyside) facing downwards and backside (non-sunny/contact side) facing upwards to better illustrate processing steps. The cross sectional diagram orientation is adjusted in FIGS. 12H through 12J.

The described process flow of the FSR-AJ is identical to the FSR-SJ embodiment described in FIG. 3 and FIGS. 4A through 4K with one important difference: there is no trench isolation step to separate the emitter and the base junctions in the case of FSR-AJ. In this case the $p^+$ and the $n^+$ regions are abutted. Thus, after opening contact areas the emitter region is exposed to the base area. So when the dopant phosphorous dopant is applied using inkjet, the drive-in has to be strong enough such that it overcomes and counterdopes the underlying and already existing boron based emitter. To facilitate this, the emitter will have a restriction of being fairly shallow. All variations and nuances discussed above for FSR-SJ flow are equally applicable to the FSR-AJ device including distributed busbar design, MESC approach, lambertian mirror strategy and various metallization strategies.

Figure 13:
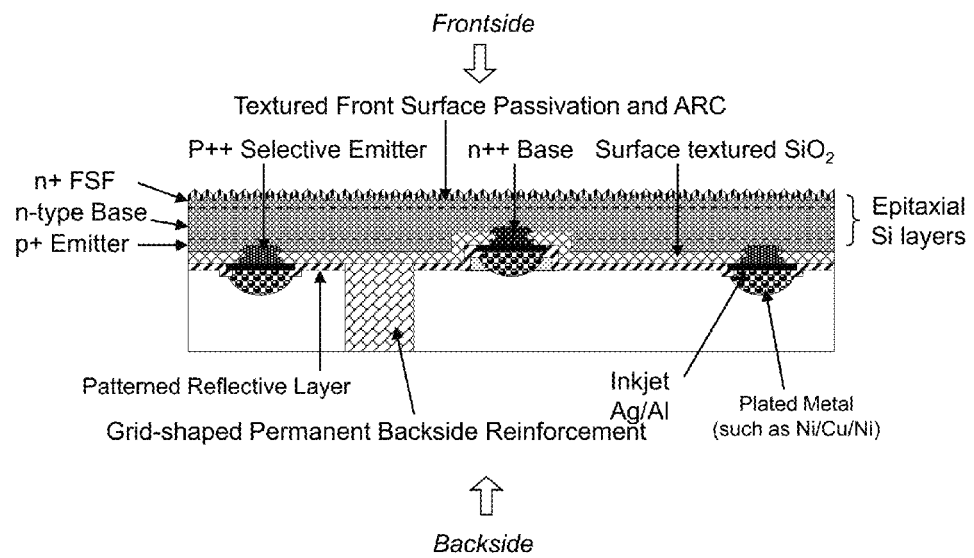
FIG. 13 is a cross sectional diagram of a back contact back junction thin film solar cell with backside reinforcement and separated junctions.

FIG. 13 is a cross sectional diagram of a back contact back junction thin film solar cell with backside reinforcement and separated junctions (this specific embodiment hereinafter referred to as an BSR-SJ cell) and integrated lambertian mirror in accordance with the disclosed subject matter. Importantly, the BSR-SJ finished cell does not have the front side reinforcement in the form of EVA/glass material stack as in the frontside reinforcement embodiments previously disclosed. Rather, reinforcement is on the backside, which may be in a shape conducive to providing mechanical strength to the standalone TFSS.

Figure 14:
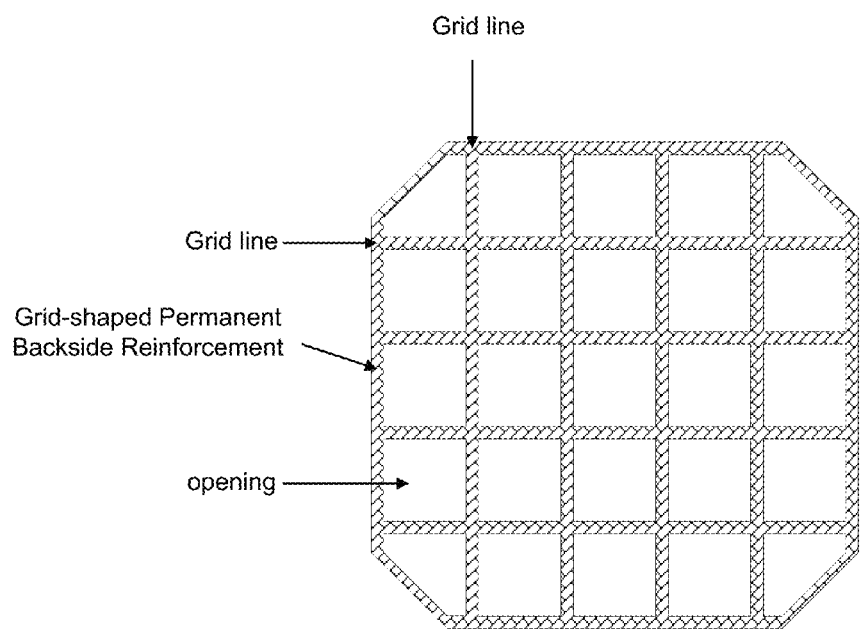
FIG. 14 is a diagram showing a backside schematic view of a grid-shaped backside reinforcement.

FIG. 14 is a diagram showing a backside schematic view of a grid-shaped backside reinforcement that may be utilized with the BSR-SJ cell. The grid-shaped backside reinforcement provides mechanical support for the thin TFSS substrate and is formed of intersecting grid lines. The width of the grid lines may be in the range of 0.3 mm to 1 mm and the thickness of the grid line can be in the range of 5 μm to 300 μm. The opening shapes—occupying the space between grid lines—may be square, rectangular, circular, or an alternative shape. In the case of square shape openings as shown in FIG. 14, the size of the squares may be in the range of 5 mm×5 mm to 50 mm×50 mm.

Figure 15:
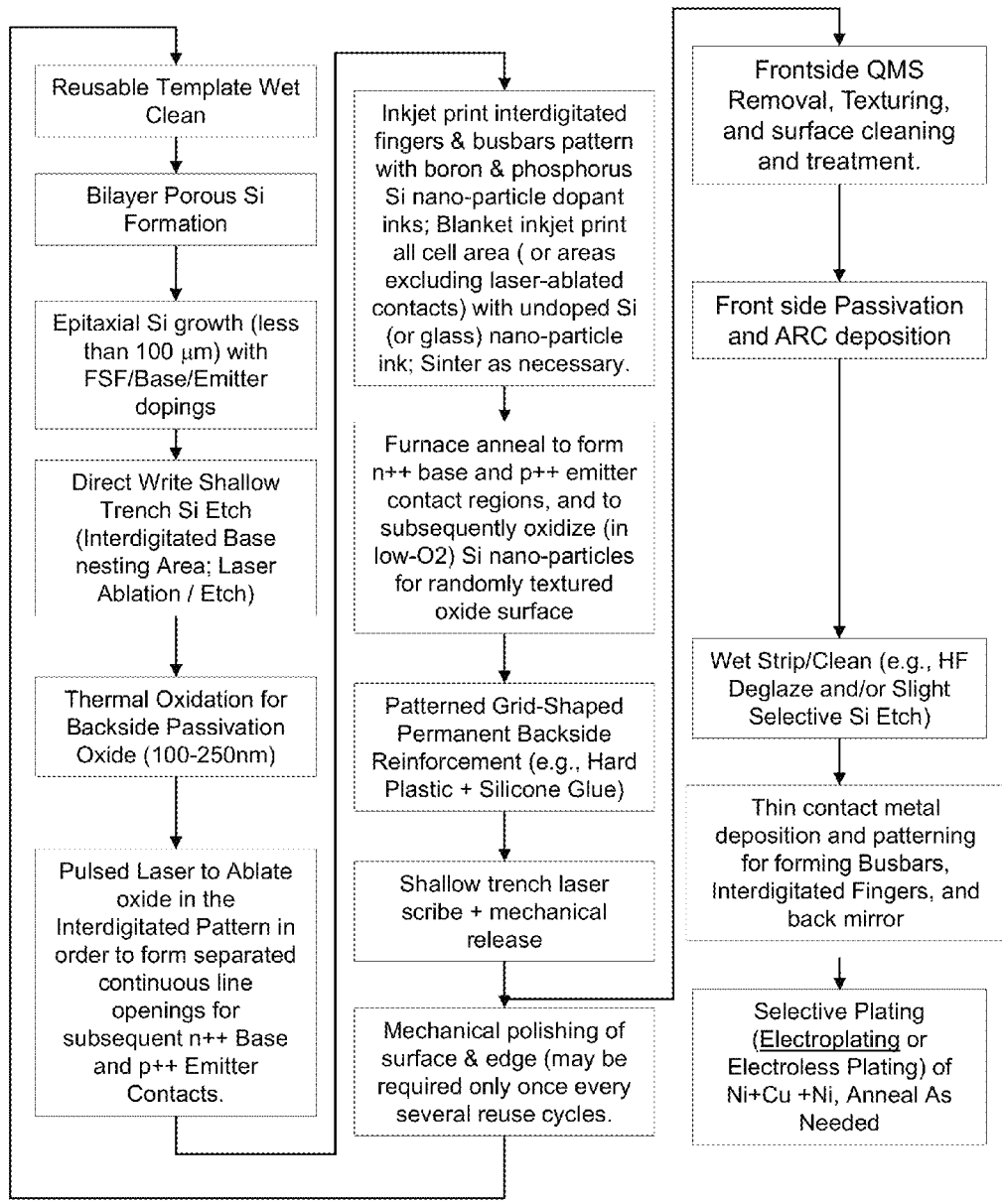
FIG. 15 is a process flow showing a fabrication process for making the back contact back junction thin film solar cell of FIG. 13.

FIG. 15 is a process flow showing a fabrication process for making a back contact back junction thin film solar cell BSR-SJ. FIGS. 16A through 16J are cross sectional diagrams of the solar cell after key fabrication process steps as it is manufactured according to the fabrication process of FIG. 15. The structural features depicted in the cross sectional diagrams of FIGS. 16A through 16J are consistent unless otherwise noted. In FIGS. 16A through 16G the cross-sectional diagrams of the solar cell show the cell with the frontside (sunnyside) facing downwards and backside (non-sunny/contact side) facing upwards to better illustrate processing steps. The cross sectional diagram orientation is adjusted in FIGS. 16H through 16J.

Figure 16A:
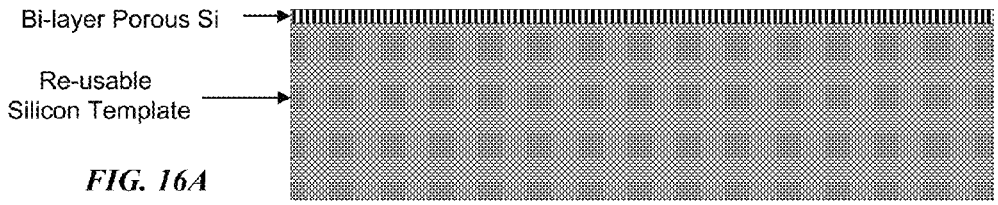
FIGS. 16A through 16J are cross sectional diagrams of the solar cell after key fabrication process of FIG. 15.
Figure 16B:
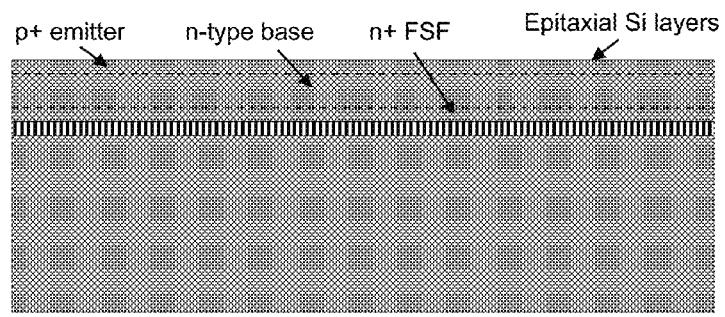
Figure 16C:
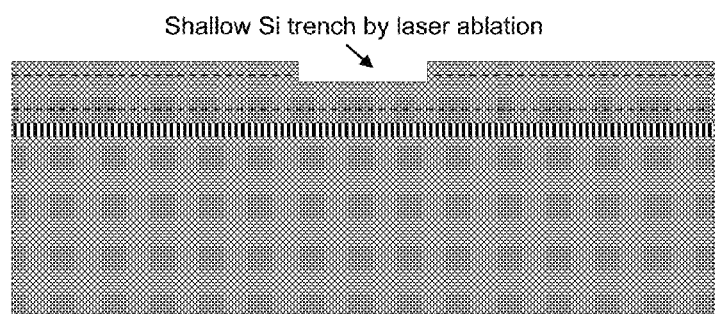
Figure 16D:
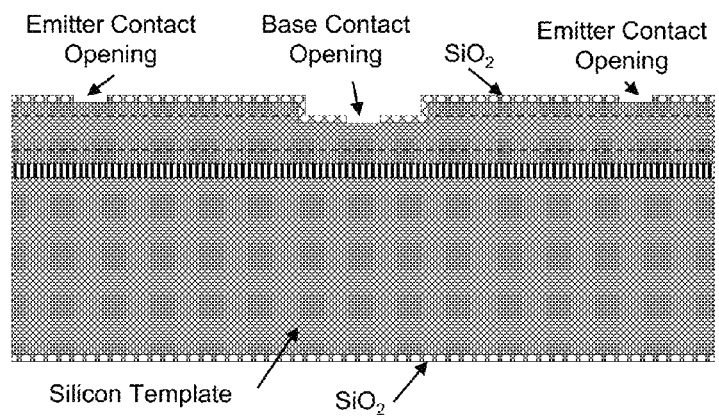
Figure 16E:
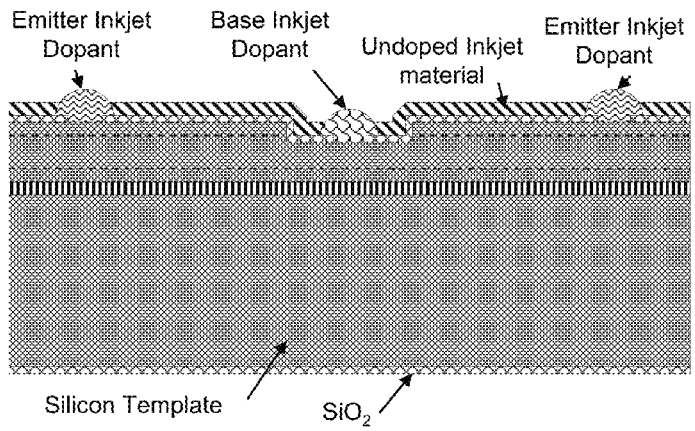
Figure 16F:
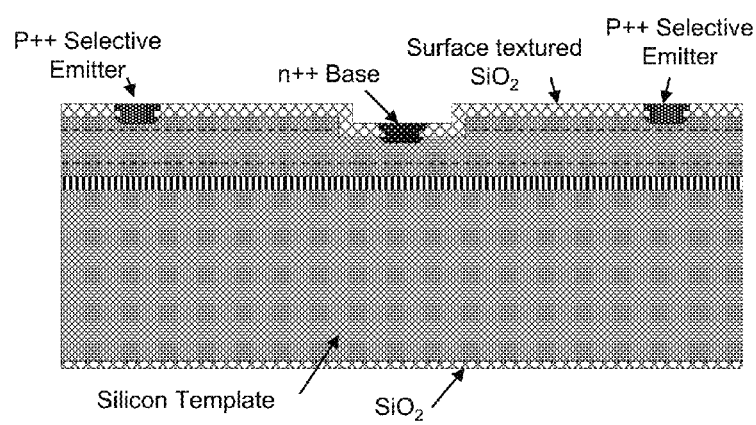
Figure 16G:
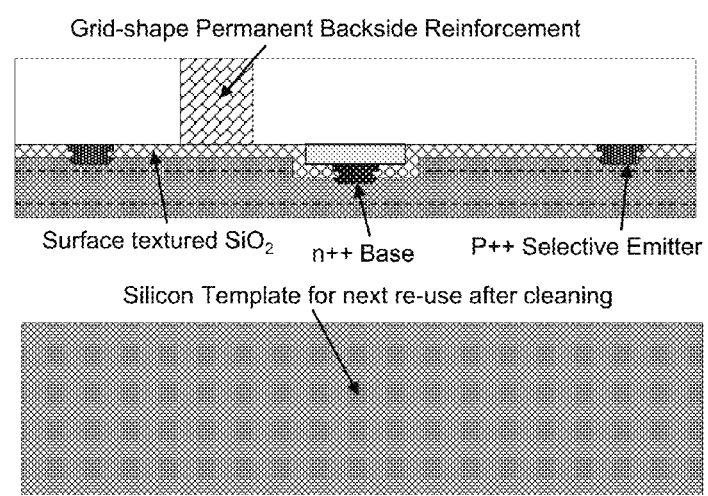
Figure 16H:
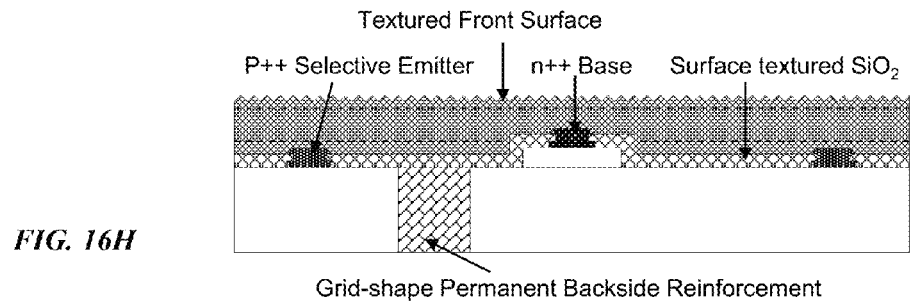
Figure 16I:
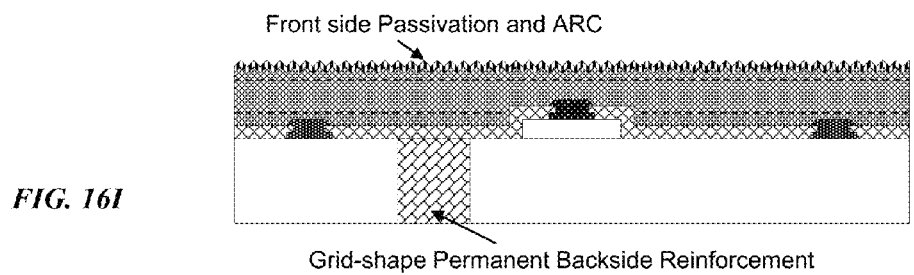
Figure 16J:
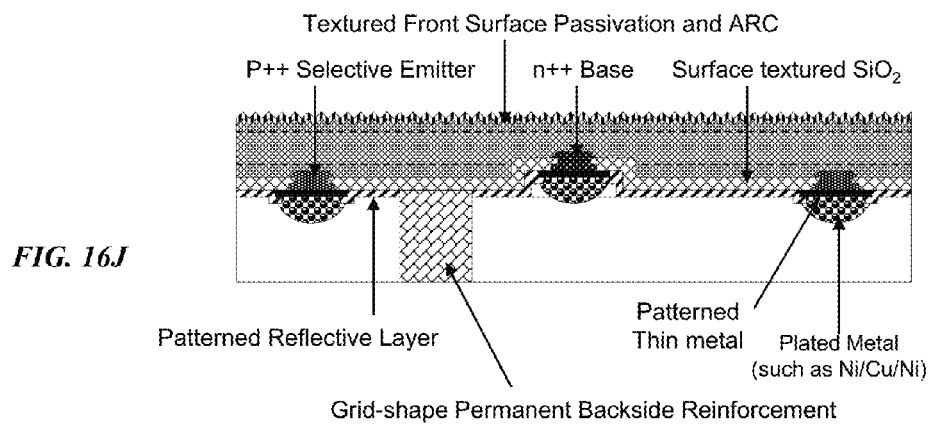

The process flow for making BSR-SJ is also similar to that for manufacturing FSR-SJ (FIG. 3), except for a few key exceptions. First, after the $n^{++}$ and $p^{++}$ base and contact region furnace anneal step on the template, FSR-SJ goes through a laser cut and release, while in the BSR-SJ fabrication flow a patterned grid shaped permanent reinforcement is attached on the cell backside. As shown in FIG. 16G, the reinforcement material should be capable of allowing subsequent processing up to 450° C., or at least 250° C., and have minimal optical absorption with very low loss. In a specific instance, the reinforcement material can be may of hard plastic, PTFE, or PV-grade silicone glue. The grid-shaped reinforcement material may be applied by screen printing, inkjet printing, or laser stereolithography rapid prototyping tool. Alternatively, a pre-fabricated grid structure from a suitable material such as PTFE or other high temperature polymeric or fiber/polymer composite materials may be laminated and thermally fused to the TFSS backside surface prior to the TFSS releasing. Since the next step involves the release TFSS, this reinforcement step allows further processing on a thin TFSS while it is free standing. This reinforcement may also be permanent because it only occurs on the backside (the nonsunny side). The frontside is ready for processing after release and can go through TFSS clean, texturing, and dielectric (e.g. SiHxNy:H) passivation deposition supported by the backside reinforcement. And the backside metallization may be processed with the reinforcement in place. The cell metallization distributed busbars and interdigitated fingers may run vertically and horizontally with respect to the Grid-Shaped patterns—preferably in an N×N distributed busbar pattern. Note that FIG. 9B shows a specific example of N×1 distributed busbar design. An N×N design allows the backside reinforcement to be placed between the bus bars.

The FSR designs have to use a temporary (such as an MESC) carrier on the backside before the front side reinforcement is put in place—this reinforcement is temporary and detaches after the frontside is reinforced. In contrast, in BSR designs the reinforcement on the backside is permanent so the fabrication process does not require the extra step of frontside reinforcement. Except for the aforementioned differences, all pre-release steps and their sequence in BSR-SJ such as, template clean, porous silicon formation, silicon trench recess, thermal oxidation, interdigitated pattern and inkjet print/anneal are common may be identical to an FSR-SJ process such as that described in FIG. 3. In addition, several post-release steps of TFSS clean, texturing, and SiHxNy:H deposition are common between FSR-SJ and BSR-SJ as well. The BSR-SJ fabrication flow may also share all the variations and nuances described for the case of FSR-SJ fabrication flow above.

Figure 17:
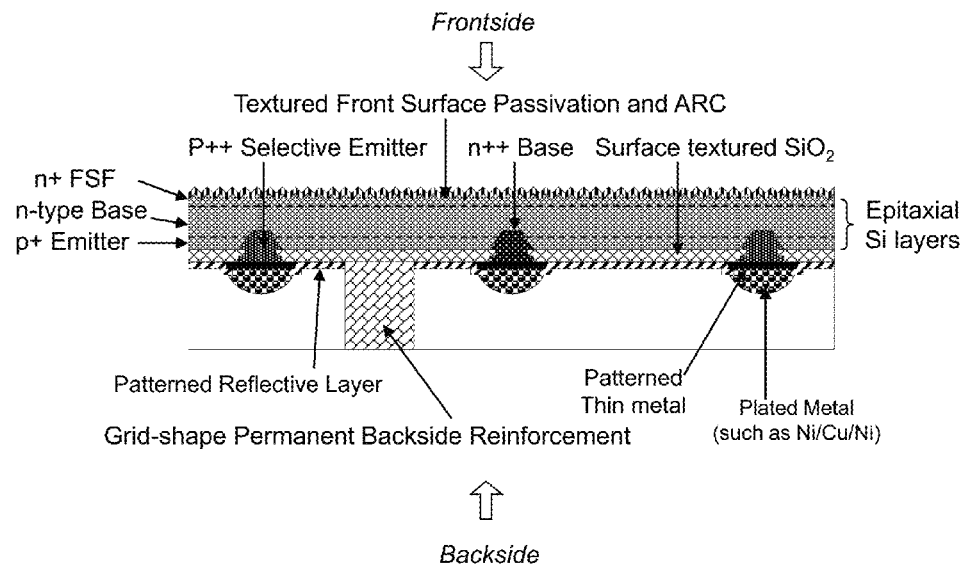
FIG. 17 is a cross sectional diagram of a back contact back junction thin film solar cell with backside reinforcement and abutted junctions.

FIG. 17 is a cross sectional diagram of a back contact back junction thin film solar cell with backside reinforcement and abutted junctions (this specific embodiment hereinafter referred to as an BSR-AJ cell) and integrated lambertian mirror in accordance with the disclosed subject matter. Importantly, the BSR-AJ finished cell does not have the front side reinforcement in the form of EVA/glass material stack as in the frontside reinforcement embodiments previously disclosed. Rather, reinforcement is on the backside, which may be in a shape conducive to providing mechanical strength to the standalone TFSS.

Figure 18:
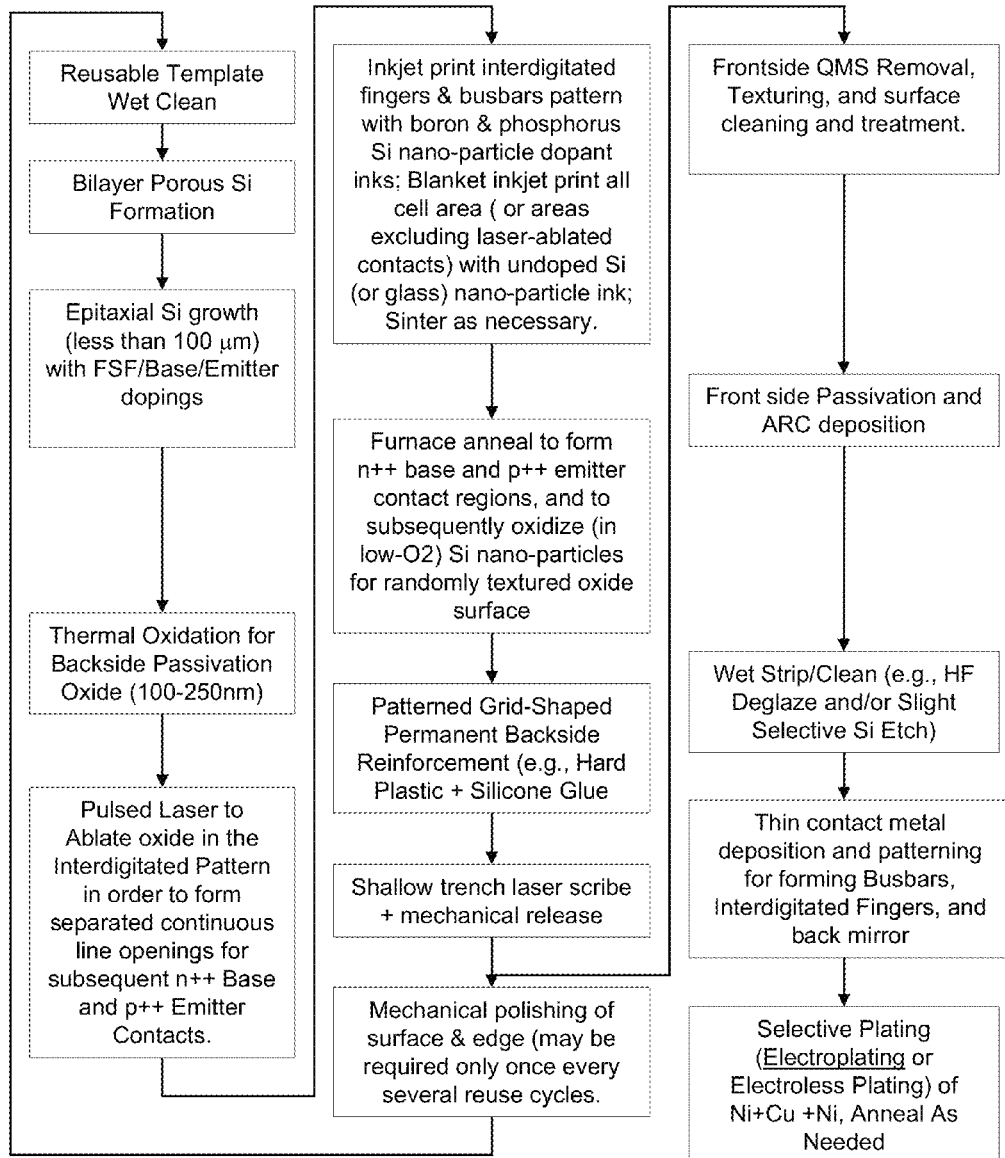
FIG. 18 is a process flow showing a fabrication process for making the back contact back junction thin film solar cell of FIG. 17.
Figure 19A:
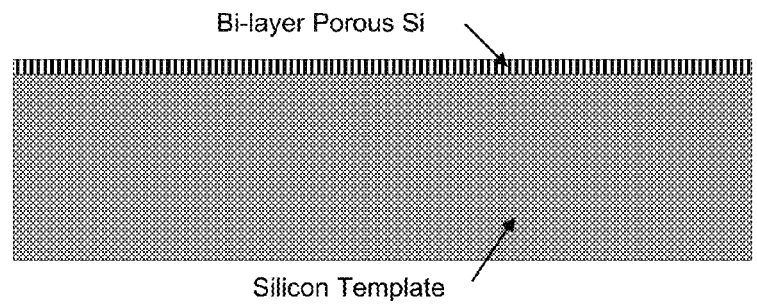
Figure 19B:
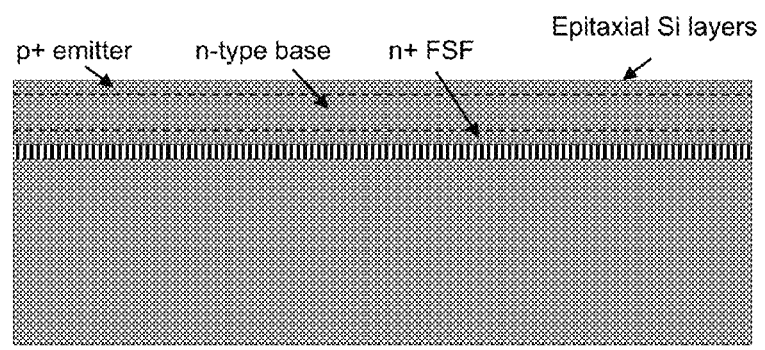
Figure 19C:
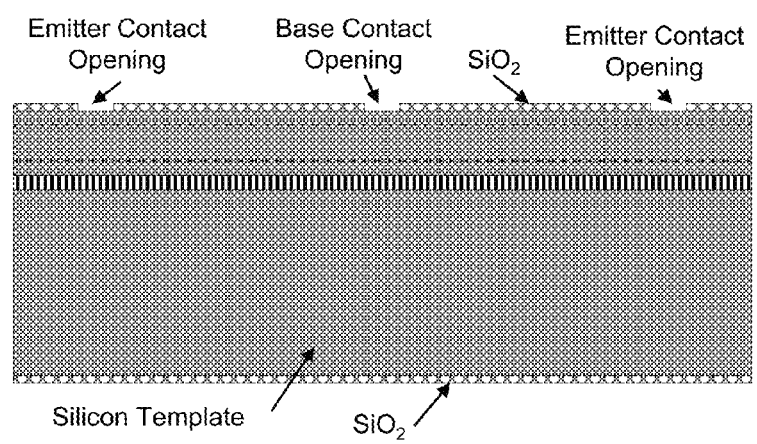
Figure 19G:
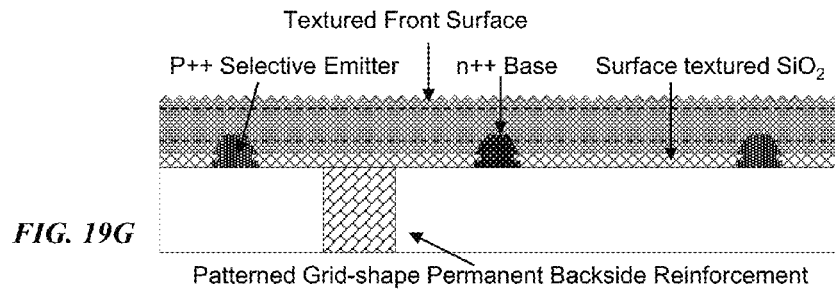
Figure 19H:
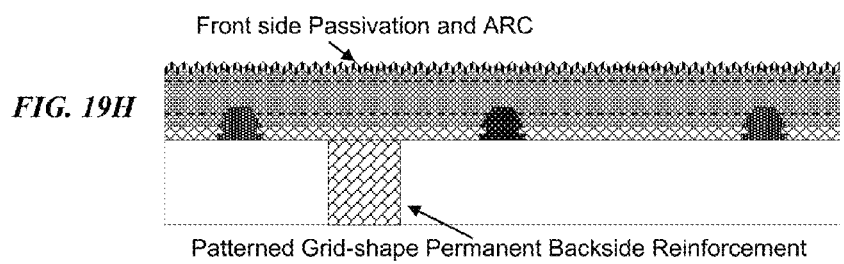
Figure 19I:
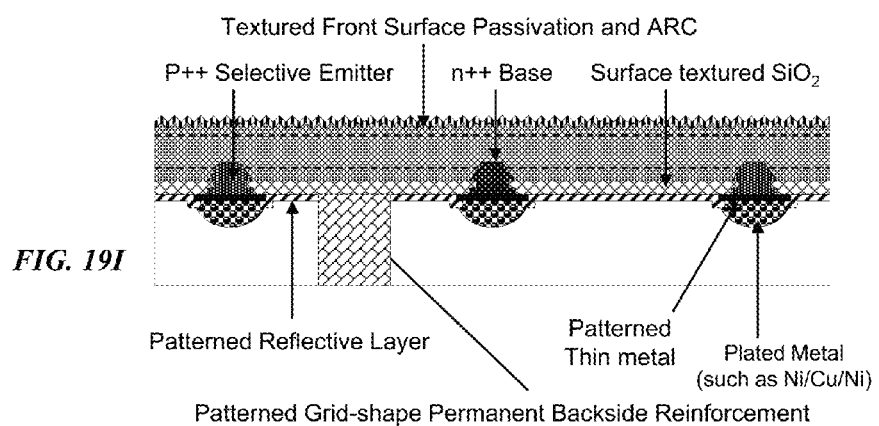

FIG. 18 is a process flow showing a fabrication process for making a back contact back junction thin film solar cell BSR-AJ. FIGS. 19A through 19I are cross sectional diagrams of the solar cell after key fabrication process steps as it is manufactured according to the fabrication process of FIG. 18. The structural features depicted in the cross sectional diagrams of FIGS. 19A through 19I are consistent unless otherwise noted. In FIGS. 19A through 19F the cross-sectional diagrams of the solar cell show the cell with the frontside (sunnyside) facing downwards and backside (non-sunny/contact side) facing upwards to better illustrate processing steps. The cross sectional diagram orientation is adjusted in FIGS. 19G through 19I.

The process flow for making BSR-AJ is also similar to that for manufacturing FSR-AJ (FIG. 11), except for a few key exceptions discussed above in the case of the BSR-SJ relating to backside reinforcement.

All of the described cell embodiments (FSR-SJ, FSR-AJ, BSR-SJ, and BSR-AJ) share a common feature of selective emitters. This refers to an attribute whereby the doping concentration of the p-type material using boron (for NBLAC rendition) under the contact area is higher than the boron doping elsewhere (where there is no contact) in the boron doped thin layer. An advantage of this structure is that it may yield a higher Voc, and thus higher cell efficiencies. However, in an alternative embodiment of the disclosed subject matter, the solar cells may not have selective emitters. Thus, the doping of the emitter (in the NBLAC case, boron doping) is the same under the contact and elsewhere. While this variation in the emitter attribute may be applied to all four of the aforementioned structures (FSR-SJ-NSE, FSR-AJ-NSE, BSR-AJ-NSE, BSR-SJ-NSE), the following describes an FSR-AJ-NSE as an example to disclose the non-selective emitter design and method of fabrication.

Figure 20:
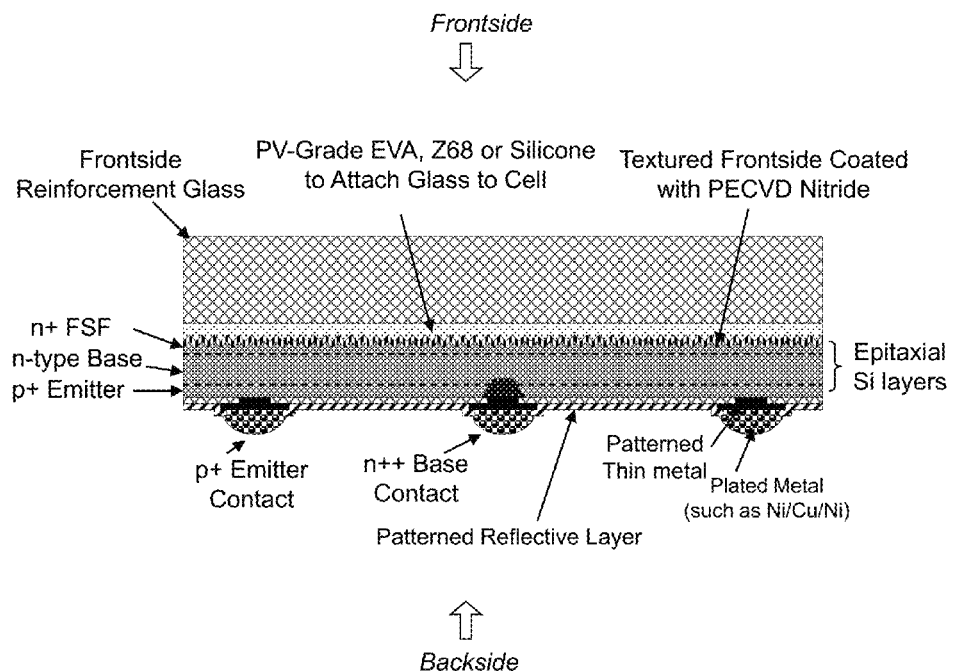
FIG. 20 is a cross sectional diagram of a back contact back junction thin film solar cell with frontside reinforcement, abutted junctions, and non-selective emitters.

FIG. 20 is a cross sectional diagram of a back contact back junction thin film solar cell with frontside reinforcement, abutted junctions, non-selective emitters (this specific embodiment hereinafter referred to as an FSR-AJ-NS cell) and integrated lambertian mirror in accordance with the disclosed subject matter. The only difference compared to the FSR-AJ embodiment of FIG. 10 is that the emitter contacts of FSR-AJ-NSE are directly made on the p+ emitter surface.

Figure 21:
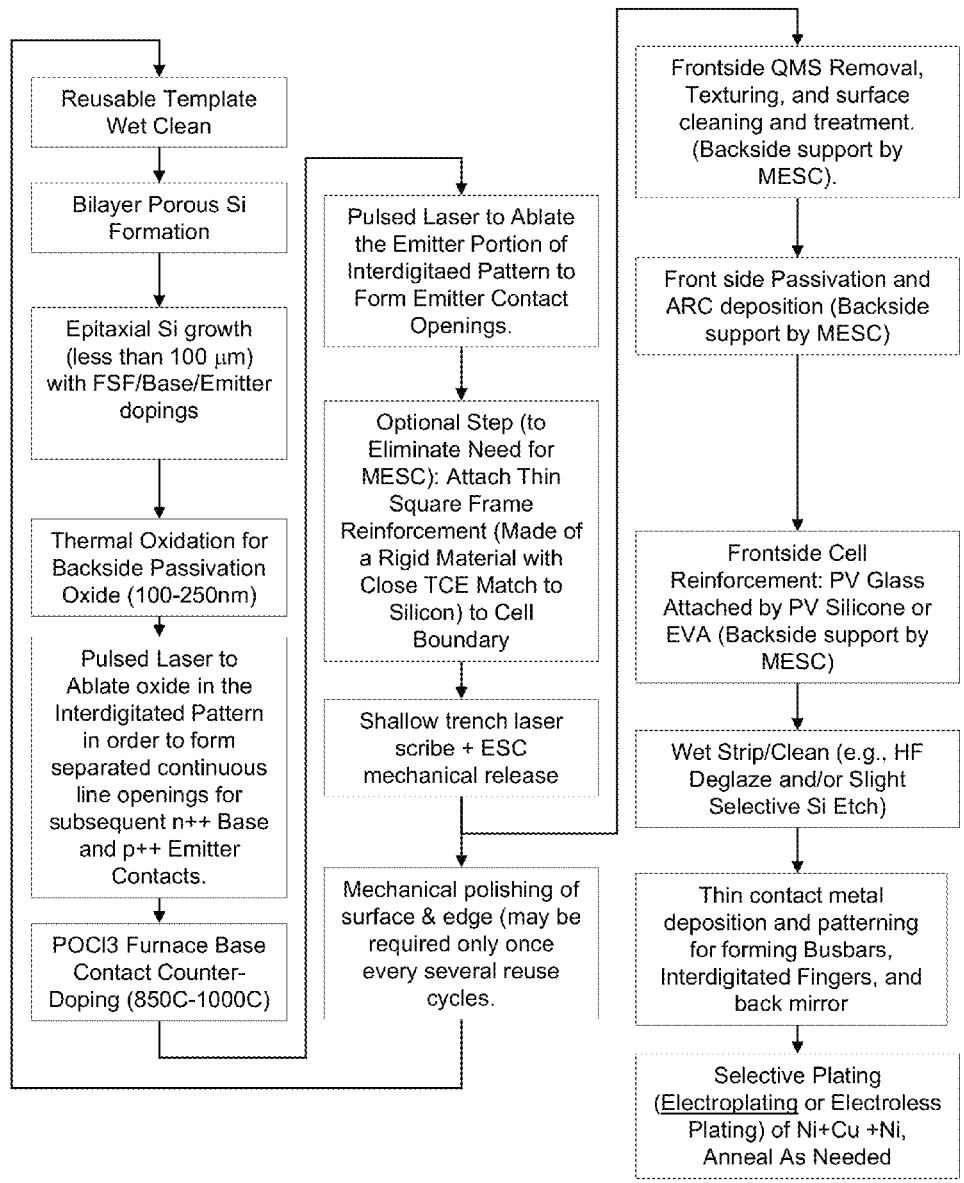
FIG. 21 is a process flow showing a fabrication process for making the back contact back junction thin film solar cell of FIG. 20.

FIG. 21 is a process flow showing a fabrication process for making a back contact back junction thin film solar cell FSR-AJ-NS. FIGS. 22A through 22J are cross sectional diagrams of the solar cell after key fabrication process steps as it is manufactured according to the fabrication process of FIG. 21. The structural features depicted in the cross sectional diagrams of FIGS. 22A through 22J are consistent unless otherwise noted. In FIGS. 22A through 22F the cross-sectional diagrams of the solar cell show the cell with the frontside (sunnyside) facing downwards and backside (non-sunny/contact side) facing upwards to better illustrate processing steps. The cross sectional diagram orientation is adjusted in FIGS. 22G through 22J.

Figure 22A:
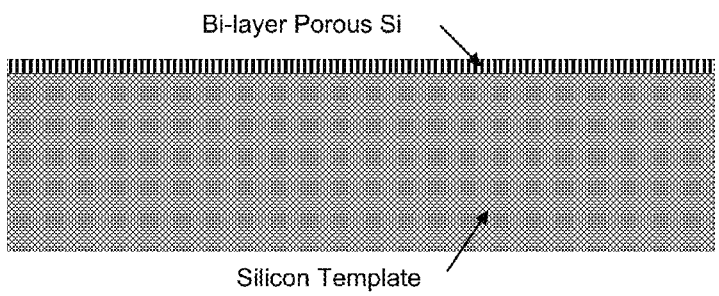
Figure 22B:
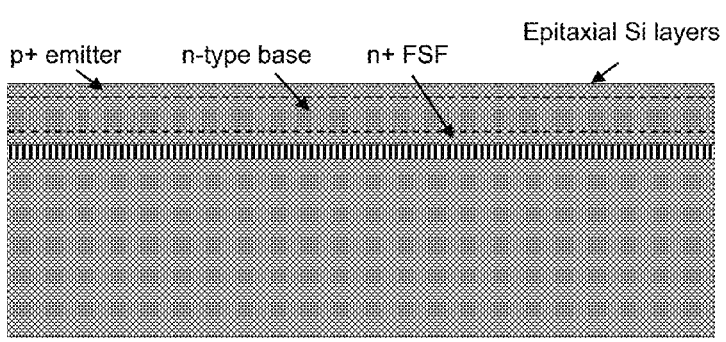
Figure 22C:
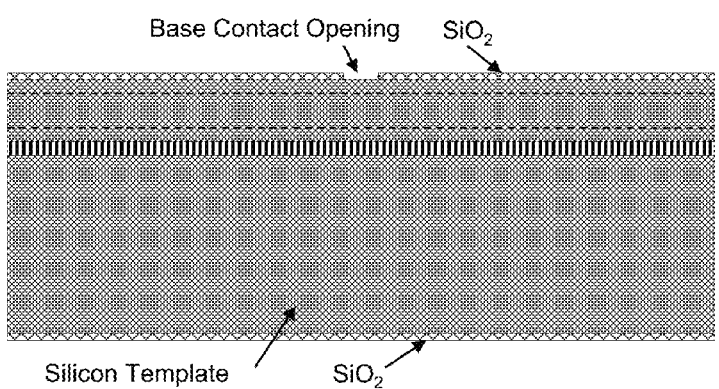
Figure 22G:
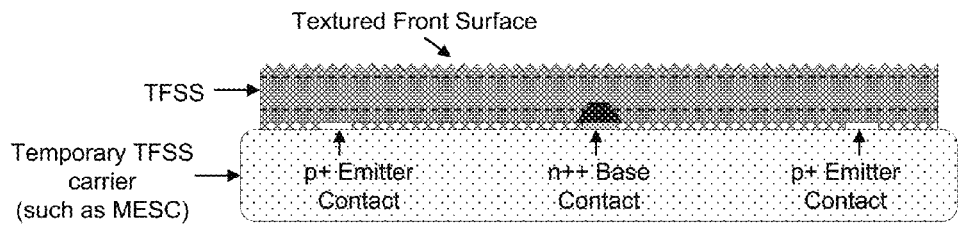
Figure 22H:
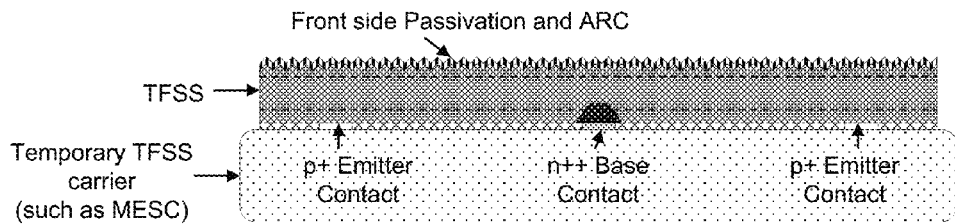
Figure 22I:
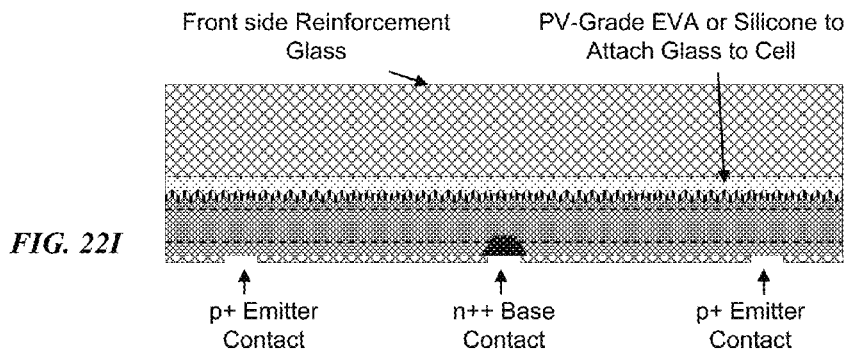
Figure 22J:
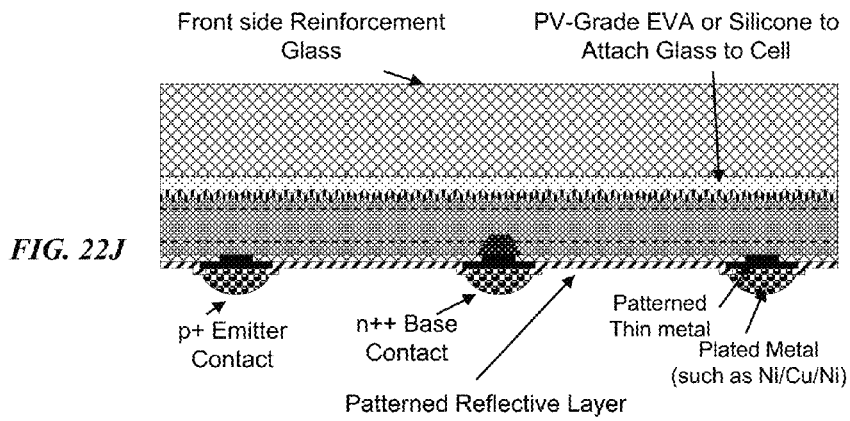

In comparison to the FSR-AJ case of FIGS. 10 and 11, only the inkjet printing of phosphorous is performed to form the selective base contacts while the inkjet printing of boron step shown in previously described process flows is omitted. Therefore, the emitter metal layer is directly applied onto the $p^+$ silicon thin layer. In an alternative embodiment, the inkjet printing of phosphorous is replaced by using POCl doping. An advantage of using POCl is that it is a mature process and has been in used production for a long time. FIG. 21 and FIG. 22D illustrate and describe the POCL-based process flow of making the FSR-AJ-NS. The template clean, porous silicon, Epi, and thermal oxidation steps are same as described previously with inkjet dopant based selective emitters. Note all variations of that process are equally applicable to this process including, but not limited to using an MESC as a temporary carrier. Post oxidation, however, the two flows (FSR-AJ-NS and FSR-AJ) diverge. In the POCl (non-selective emitter) flow describes and shown in FIG. 21 and FIGS. 22A through 22J, oxidation is followed by laser ablation only of the base area as opposed to both base and emitter at the same time. Subsequently, a POCL furnace based contact doping is done in the ablated areas. In this FSR-AJ-NSE embodiment, the POCl condition has to be strong enough to counter-dope the emitter area. And the oxide thickness has to be thick enough such that the phosphorous is blocked everywhere except where the oxide is ablated by the previous laser step. This step is subsequently followed by the oxide ablation using the laser to open emitter and base contact areas. A reason both base and emitter areas may not be ablated at the same time prior to the POCl process is because POCl is gas phase doping and would have also gone in the emitter area while intended to counter-dope the base area only. In the FSR-AJ-NE fabrication embodiment, subsequent to the emitter ablation by laser the TFSS will be released with a mobile carrier attached on the ablated side (non-sunnyside). Then the following fabrication steps including TFSS clean, texturing, SiHxNy:H deposition, front side reinforcement, and finally metallization are described earlier in context of FIG. 3 are applicable to this flow with all their variations already discussed.

In a different embodiment of the POCl based fabrication flow, to create the FSR-SJ-NS version, a silicon etch of the base nesting area will be added after thermal oxidation and before the base ablation using the laser. All methods of silicon etching to create the trench isolation (recess) described in the context of FIG. 3 are equally applicable to this structure.

In different embodiments of the POCl based fabrication flow to create the BSR-AJ-NS and BSR-SJ-NS versions, the flows are similar to FSR-AJ-NS and FSR-SJ-NS, respectively, except, in the BSR version before release and after the emitter contact openings are formed there is a permanent reinforcement, using for example a hard plastic material and silicone glue, on the cell backside. As described, in one embodiment the shape of this reinforcement may be grid-shape. Another difference of the BSR version compared to FSR in the nonselective emitter case, is that the BSR versions do not use a temporary mobile carrier for reinforcement on the non-sunnyside as there is already a permanent reinforcement in place. This eliminates the step of attaching the front side reinforcement before the final step of metallization is required. In the BSR case the metallization is done with the backside reinforcement in place working around the reinforcement pattern. As described in the context of the inkjet selective emitter flows, this may make the N×N busbar design more conducive to metallization for the both BSR designs.

In operation, the disclosed subject matter provides for the following:

A solar cell made on a released thin film silicon substrate (TFSS) that is substantially planar and is front side reinforced (FSR) by temporary and/or permanent carriers. The solar cell has back contacts, separated junctions (SJ), selective emitters, and integrated Lambertian mirror. This type of solar cells is referred to as FSR-SJ cells.

A solar cell made on a released thin film silicon substrate (TFSS) that is substantially planar and is front side reinforced (FSR) by temporary and/or permanent carriers. The solar cell has back contacts, abutted junctions (AJ), selective emitters, and integrated Lambertian mirror. This type of solar cells is referred to as FSR-AJ cells.

A solar cell made on a released thin film silicon substrate (TFSS) that is substantially planar and is backside reinforced (BSR) by temporary and/or permanent carriers. The solar cell has back contacts, separated junctions (SJ), selective emitters, and integrated Lambertian mirror. This type of solar cells is referred to as BSR-SJ cells.

A solar cell made on a released thin film silicon substrate (TFSS) that is substantially planar and is backside reinforced (BSR) by temporary and/or permanent carriers. The solar cell has back contacts, abutted junctions (AJ), selective emitters, and integrated Lambertian mirror. This type of solar cells is referred to as BSR-AJ cells.

A solar cell made on a released thin film silicon substrate (TFSS) that is substantially planar and is front side reinforced (FSR) by temporary and/or permanent carriers. The solar cell has back contacts, separated junctions (SJ), none-selective emitters (NSE), and integrated Lambertian mirror. This type of solar cells is referred to as FSR-SJ-NSE cells.

A solar cell made on a released thin film silicon substrate (TFSS) that is substantially planar and is front side reinforced (FSR) by temporary and/or permanent carriers. The solar cell has back contacts, abutted junctions (AJ), none-selective emitters (NS), and integrated Lambertian mirror. This type of solar cells is referred to as FSR-AJ-NSE cells.

A solar cell made on a released thin film silicon substrate (TFSS) that is substantially planar and is backside reinforced (BSR) by temporary and/or permanent carriers. The solar cell has back contacts, separated junctions (SJ), none-selective emitters (NS), and integrated Lambertian mirror. This type of solar cells is referred to as BSR-SJ-NSE cells.

A solar cell made on a released thin film silicon substrate (TFSS) that is substantially planar and is backside reinforced (BSR) by temporary and/or permanent carriers. The said solar cell has back contacts, abutted junctions (AJ), none-selective emitters (NSE), and integrated Lambertian mirror. This type of solar cells is referred to as BSR-AJ-NSE cells.

Variations among the selection of types of substrate reinforcement (FSR or BSR, temporary or permanent), junctions (SJ or AJ), emitters (SE or NSE), and Lambertian mirrors (integrated or separated), are all considered in the scope of claims of the present invention.

Further, fabrication aspects include, a first carrier is a thick semiconductor (e.g., preferably crystalline silicon for crystalline silicon solar cells) wafer—reusable template—while the second carrier is a low cost material capable of supporting TFSS—a permanent backside reinforcement (which is permanently attached to the cell). The reusable template carrier, because it is standard thick silicon wafer, is capable of withstanding high temperature. This host wafer may be in various sizes such as 200 mm or 300 mm round or square, thicknesses capable of going through full solar cell process without breaking such as 200 µm upwards (including semiconductor standard 300 mm diameter, 750 µm thick wafers), and may also take square or other geometrical form factor of any size. The amortized cost of this carrier is brought down significantly by reusing it over again and amortizing it over a plurality of TFSS fabrication cycles. This carrier must also satisfy the aforementioned third criteria of being conducive for high-yield detachment of TFSS or thin epitaxial substrate (thus making it the reusable temporary carrier). This is accomplished using a porous silicon layer (preferably a bilayer with two porosities or a multilayer with multiple porosities) between the template and the TFSS. This porous silicon thin layer is easily formed on top of the carrier using subtractive electrochemical process. The porosity of this layer is catered to strike the right balance such that the layer is porous enough (and mechanical weak enough) to detach with ease (using any of the release processes such as mechanical release (MR) or sonicated mechanical release in a liquid (SMR), while simultaneously not too porous such that it is conducive for both growth of a high quality, low-defectivity thin TFSS and allows for no premature release during on-carrier process. One approach is to use a porous silicon multilayer with at least two different porosities (i.e., a bilayer porous silicon), with the bottom layer next to the template having a higher porosity value and the top layer of porous silicon next to the epitaxial layer having a lower porosity value. This results in specific doping requirements for the template carrier.

Additional fabrication aspects include the second carrier, and subsequent carriers, required for providing temporary mechanical support during various processing steps in manufacturing the solar cell from the said released TFSS. Examples of the processing steps include MR, metallization, front surface texturing and passivation. Examples of the carriers include mobile electrostatic chucks (MESC), mobile vacuum chucks (MOVAC) and mobile chucks with a removable adhesive layer.

Additional aspects of the present disclosure include the use of short laser pulses with sub-nanosecond pulse duration is described to accomplish the contact opening for at least one, preferably both polarities of the contacts of the back junction back contact solar cell. Also, the use of laser pulses is described to accomplish the doping of the contact areas for at least one, preferably both polarities of the contacts regions to the above described back junction back contact solar cell.

Additional fabrication aspects a last carrier providing a permanent reinforcement of the thin solar cell and supporting it in a solar cell module. There are several choices of backside supports/reinforcements including low cost soda lime glass and various low cost plastic materials.

The foregoing description of the preferred embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A back contact back junction thin solar cell, comprising:
   a deposited semiconductor layer, comprising:
      a light capturing frontside surface with a passivation layer,
      a doped base region, and
      a doped backside emitter region with a polarity opposite said doped base region;
   a backside passivation dielectric layer and patterned reflective layer on said backside emitter region, wherein said backside passivation dielectric layer and said patterned reflective layer form a light trapping backside mirror;
   backside emitter contacts and backside base contacts connected to metal interconnects forming an interdigitated metallization pattern on the backside of said back contact back junction thin solar cell; and
   a backside reinforcement on the backside of said back contact back junction thin solar cell, said backside reinforcement having access openings providing access to said metal interconnects.

2. The back contact back junction thin solar cell of claim 1, wherein said deposited semiconductor layer is an epitaxial silicon layer with a thickness in the range of 15 to 50 microns.

3. The back contact back junction thin solar cell of claim 1, wherein said deposited semiconductor layer is a planar epitaxial silicon layer.

4. The back contact back junction thin solar cell of claim 1, wherein said light capturing frontside surface with a passivation layer serves as an anti-reflection coating.

5. The back contact back junction thin solar cell of claim 1, wherein said light capturing frontside surface with a passivation layer provides field assisted passivation.

6. The back contact back junction thin solar cell of claim 1, wherein said doped backside emitter region is an in-situ doped epitaxial emitter region with an emitter junction thickness of less than 3 microns.

7. The back contact back junction thin solar cell of claim 1, wherein said interdigitated metallization pattern is a distributed array of interdigitated fingers and busbars.

8. The back contact back junction thin solar cell of claim 1, wherein higher concentration base doping regions under said backside base contacts are separated from emitter regions, thereby forming separated junctions.

9. The back contact back junction thin solar cell of claim 1, wherein higher concentration base doping under said backside base contacts abut emitter regions, thereby forming abutted junctions.

10. The back contact back junction thin solar cell of claim 1, wherein said mirror is a lambertian mirror.

11. The back contact back junction thin solar cell of claim 1, wherein the localized doping concentrations under said emitter contact are higher than said doped backside emitter region, thereby forming selective emitter contacts.

12. The back contact back junction thin solar cell of claim 1, wherein said backside reinforcement is a permanent support reinforcement plate and said access openings are through-hole openings.

13. The back contact back junction thin solar cell of claim 1, wherein said backside passivation dielectric layer is aluminum oxide.

14. The back contact back junction thin solar cell of claim 1, wherein said backside reinforcement is a permanent support reinforcement plate and said access openings are through-hole openings.

15. The back contact back junction thin solar cell of claim 1, wherein said backside reinforcement is a backside grid-shaped support reinforcement.

16. The back contact back junction thin solar cell of claim 1, wherein said dopes backside emitter region is a doped backside epitaxial region.

* * * * *